US012573435B2

(12) United States Patent　(10) Patent No.:　US 12,573,435 B2
Jin et al.　(45) Date of Patent:　Mar. 10, 2026

(54) MEMORY, OPERATION METHOD OF MEMORY, AND MEMORY SYSTEM

(71) Applicant: YANGTZE MEMORY TECHNOLOGIES CO., LTD., Wuhan (CN)

(72) Inventors: Chong Jin, Wuhan (CN); Jing Zhang, Wuhan (CN); Yan Wang, Wuhan (CN); Teng Chen, Wuhan (CN); Difei Huang, Wuhan (CN); Ke Liang, Wuhan (CN); Jie Ma, Wuhan (CN); Weiwei He, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 197 days.

(21) Appl. No.: 18/222,836

(22) Filed: Jul. 17, 2023

(65) Prior Publication Data

US 2024/0331749 A1　Oct. 3, 2024

(30) Foreign Application Priority Data

Apr. 3, 2023　(CN) .......................... 202310349228.0

(51) Int. Cl.
　*G11C 7/12*　(2006.01)
　*G11C 5/06*　(2006.01)
　*G11C 5/14*　(2006.01)

(52) U.S. Cl.
　CPC ................ *G11C 7/12* (2013.01); *G11C 5/063* (2013.01); *G11C 5/14* (2013.01)

(58) Field of Classification Search
　CPC .. G11C 7/12; G11C 5/063; G11C 5/14; G11C 16/24; G11C 16/34
　USPC ......................................................... 365/226
　See application file for complete search history.

(56) References Cited

U.S. PATENT DOCUMENTS

2018/0182444 A1* 6/2018 Yamada .............. G11C 11/2273

FOREIGN PATENT DOCUMENTS

CN　　　1492445 A *　4/2004　............... G11C 7/14

* cited by examiner

*Primary Examiner* — Huan Hoang
(74) *Attorney, Agent, or Firm* — BAYES PLLC

(57) ABSTRACT

According to some aspects, a memory includes a bit line discharge circuit and a bit line coupled to the bit line discharge circuit. The bit line discharge circuit includes a transistor, a control branch, and a first discharge branch. A gate of the transistor is connected with the control branch. One of a source or a drain of the transistor is connected with the first discharge branch. Another of the source or the drain of the transistor is connected with the bit line. The control branch is configured to turn on the transistor. The first discharge branch is configured to discharge the bit line at a set discharge speed when the transistor is turned on.

20 Claims, 14 Drawing Sheets

<u>100</u>

MEMORY, OPERATION METHOD OF MEMORY, AND MEMORY SYSTEM

CROSS-REFERENCE TO RELATED APPLICATIONS

This application claims the benefit of priority to Chinese Application No. 202310349228.0, filed on Apr. 3, 2023, which is incorporated herein by reference in its entirety.

FIELD

The present disclosure relates to the memory technology field, particularly to a memory, an operation method of memory and a memory system.

BACKGROUND

With the development of memory technology, memories are applied more and more. Memories support various operations such as reading, programming, erasing and bit line discharging. Among them, the bit line discharging operation of a memory functions to discharge bit lines applied with a high voltage.

For example, in the process of erasing a memory, a high voltage needs to be applied to bit lines coupled with a memory string to be erased to draw electrons stored in memory cells in the memory string to be erased into the channel with the attraction of the high voltage, thereby realizing data erasure. After the erasure is finished, bit lines coupled with the memory string that have been erased need to be discharged to prevent the high voltage on the bit lines coupled with the erased memory strings from suppressing subsequent programming operations.

SUMMARY

The present disclosure provides a memory, an operation method of memory and a memory system that may improve the stability of the bit line discharge. The technical solution is as follows.

In an aspect, an implementation of the present disclosure provides a memory. The memory may include a bit line discharge circuit and a bit line coupled to the bit line discharge circuit. The bit line discharge circuit may include a transistor, a control branch, and a first discharge branch. A gate of the transistor may be connected with the control branch. One of a source or a drain of the transistor may be connected with the first discharge branch, and another of the source and drain of the transistor may be connected with the bit line. The control branch may be configured to turn on the transistor. The first discharge branch may be configured to discharge the bit line at a set discharge speed when the transistor is turned on.

In a possible implementation, the control branch may include a first sub-branch for applying a second voltage to the gate of the transistor when a voltage on the bit line is not smaller than the first voltage. The first voltage may be greater than a target voltage to which the bit line needs to be discharged and the second voltage being greater than a threshold voltage of the transistor.

In a possible implementation, the memory may further include a source line. The first sub-branch may include a voltage difference control module connected in series between the gate of the transistor and the source line. The first sub-branch may be configured to apply the second voltage output by the voltage difference control module to the gate of the transistor when the voltage on the bit line is not smaller than the first voltage. A difference between the second voltage and the voltage on the source line may be a reference voltage and the source line and the bit line may be coupled at two ends of a same memory string.

In a possible implementation, the first sub-branch may include a first power supply connected with the gate of the transistor and the first sub-branch may be configured to apply a second voltage provided by the first provided by the first power supply to the gate of the transistor when a voltage on the bit line is not smaller than the first voltage.

In a possible implementation, the control branch may further include a second sub-branch for applying a third voltage to the gate of the transistor when a voltage on the bit line is smaller than the first voltage. The third voltage may be smaller than the threshold voltage of the transistor. The bit line discharge circuit may further include a second discharge branch connected with the bit line for discharging the voltage on the bit line to the target voltage when the third voltage is applied to the gate of the transistor. When the voltage on the bit line is smaller than the first voltage, a discharge speed at which the second discharge branch discharges the bit line may be greater than a discharge speed at which the first discharge branch discharges the bit line.

In a possible implementation, the second sub-branch may include a second power supply connected with the gate of the transistor and the first second-branch may be configured to apply the third voltage provided by the second power supply to the gate of the transistor when a voltage on the bit line is smaller than the first voltage.

In a possible implementation, the memory may further include a source line. One of a source or a drain of the transistor may be connected with the first discharge branch via the source line. The source line and the bit line may be coupled at two ends of a same memory string.

In a possible implementation, one of a source or a drain of the transistor is directly connected with the first discharge branch.

In another aspect, an implementation of the present disclosure provides a method of operating a memory. The memory may include a bit line discharge circuit and a bit line coupled to the bit line discharge circuit. The bit line discharge circuit may include a transistor and a first discharge branch.

In some implementations, the method may include turning on the transistor. One of a source or a drain of the transistor may be connected with the first discharge branch, and another of the source and drain of the transistor may be connected with the bit line.

In some implementations, the method may include discharging the bit line at a set discharge speed via a turned on transistor with the first discharge branch.

In a possible implementation, the turning on the transistor may include applying a second voltage to the gate of the transistor when a voltage on the bit line is not smaller than the first voltage. The first voltage may be greater than a target voltage associated with a discharging of the bit line and the second voltage may be greater than a threshold voltage of the transistor.

In a possible implementation, the memory may further include a source line, the bit line discharge circuit may further include a voltage difference control module connected in series between the gate of the transistor and the source line. The applying the second voltage to the gate of the transistor when the voltage on the bit line is not smaller than the first voltage may include applying the second voltage output by the voltage difference control module to the gate of the transistor when the voltage on the bit line is not smaller than the first voltage. A voltage difference between the second voltage and the voltage on the source line may be a reference voltage, and the source line and the bit line may be coupled at two ends of a same memory string.

In a possible implementation, the bit line discharge circuit may further include a first power supply connected with the gate of the transistor. The applying the second voltage to the gate of the transistor when the voltage on the bit line is not smaller than the first voltage may include applying the second voltage provided by the first power supply to the gate of the transistor when the voltage on the bit line is not smaller than the first voltage.

In a possible implementation, the bit line discharge circuit may further include a second discharge branch connected with the bit line. The method may further include applying a third voltage to the gate of the transistor when the voltage on the bit line is smaller than the first voltage, the third voltage being smaller than the threshold voltage of the transistor. The method may further include discharging a voltage on the bit line to the target voltage with the second discharge branch. When the voltage on the bit line is smaller than the first voltage, a discharge speed at which the second discharge branch discharges the bit line may be greater than a discharge speed at which the first discharge branch discharges the bit line.

In a possible implementation, the bit line discharge circuit may further include a second power supply connected with the gate of the transistor. The applying the third voltage to the gate of the transistor when the voltage on the bit line is smaller than the first voltage may include applying the third voltage provided by the second power supply to the gate of the transistor when the voltage on the bit line is smaller than the first voltage.

In a possible implementation, the memory may further include a source line. One of a source or a drain of the transistor may be connected with the first discharge branch via the source line. The source line and the bit line may be coupled at two ends of a same memory string. The discharging the bit line at a set discharge speed via a turned on transistor with the first discharge branch may include discharging the source line at a set discharge speed with the first discharge branch such that the bit line is discharged via the turned on transistor at a same discharge speed as the source line.

In a possible implementation, one of a source and a drain of the transistor is connected with the first discharge branch directly; and discharging the bit line at the set discharge speed via a turned on transistor with the first discharge branch comprises:

discharging the bit line at a set discharge speed directly via a turned on transistor with the first discharge branch.

In a possible implementation, the method may further include detecting a voltage on the source line after discharging if the source line has been discharged. The method may further include disconnecting the voltage difference control module and the source line before a sum of the voltage on the source line after discharging and the reference voltage is smaller than the threshold voltage of the transistor so that a voltage applied on the gate of the transistor is greater than the threshold voltage of the transistor.

In a possible implementation, the memory may further include a source line. If one of a source and a drain of the transistor is connected with the first discharge branch via the source line, or one of a source and a drain of the transistor is connected with the first discharge branch directly and connected with the source line directly, the method may further include controlling the first discharge branch to be in a non-operating state and transmitting the voltage on the source line to the bit line via the turned on transistor to allow the bit line to have a voltage same as the source line; the source line and the bit line being coupled at two ends of a same memory string.

In another aspect, an implementation of the present disclosure provides a memory system comprising any one of the memories described above; and a controller coupled with the memory and configured to control the memory.

The technical solution provided in implementations of the present disclosure provides at least the following beneficial effects.

In the memory provided in the present disclosure, the bit line and the first discharge branch are located at two ends, namely source and drain of the transistor so that it is possible to connect the bit line and the first discharge branch by turning on the transistor and in turn discharge the bit line at a set discharge speed with the first discharge branch. The discharge speed of the bit line is controllable and the stability of the bit line discharge is high, which facilitates improving the operating stability of the memory in the bit line discharge process.

BRIEF DESCRIPTION OF THE DRAWINGS

In order to describe the technical solutions in implementations of the present disclosure more clearly, accompanying drawings required in describing implementations will be described in brief below. It is obvious that the below described drawings are only some implementations of the present disclosure and other drawings may be obtained for those skilled in the art according to these drawings without any creative work.

DETAILED DESCRIPTION

In order to make the objects, technical solutions, and advantages of the present disclosure clearer, implementations of the present disclosure will be described in further detail below in connection with the accompanying drawings.

It is to be noted that terms "first", "second" etc. in the present disclosure are used to distinguish similar objects and not necessarily to describe particular order or sequential order. It should be understood that terms used herein may be interchanged as appropriate to allow implementations of the present disclosure described herein to be implemented in an order other than those illustrated or described herein. Implementations described in the following example implementations do not represent all implementations pursuant to the present disclosure. In contrast, they are only examples pursuant to some aspects of the present disclosure.

It should be readily understood that the meaning of "on", "above", and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to (one or more) another elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may also be interpreted accordingly.

Figure 1:
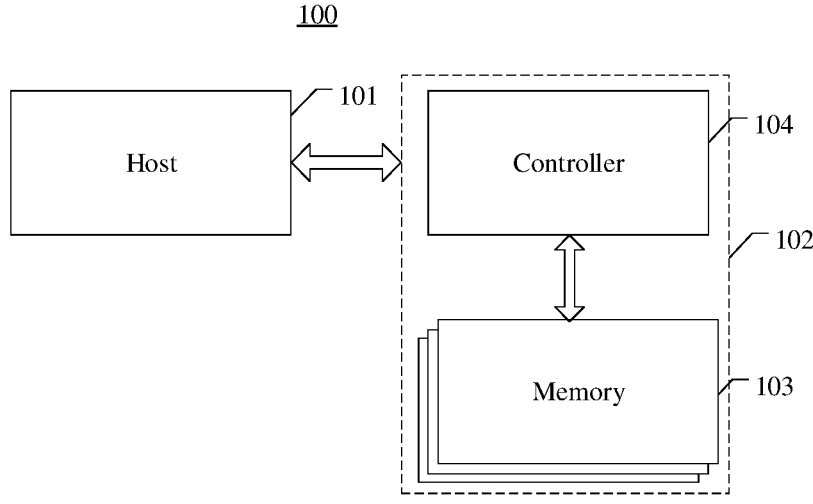
FIG. 1 is a structure diagram of an electronic system provided in an implementation of the present disclosure.

FIG. 1 shows a diagram of an electronic system provided in an implementation of the present disclosure. The electronic system 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having memory devices therein.

As shown in FIG. 1, the electronic system 100 includes a host 101 and a memory system 102 coupled to the host 101, wherein the host 101 may be a processor of an electronic device such as a central processing unit (CPU) or a system-on-chip (SoC), for example an application processor (AP). The host 101 may be configured to send data to the memory system 102. Alternatively, the host 101 may be configured to receive data from the memory system 102.

The memory system 102 includes one or more memor(ies) 103 and a controller 104, wherein the controller 104 is coupled to the memory 103. The memory 103 may be any type of memory. Optionally, the memory 103 is a NAND (Not AND) flash memory such as a 3D NAND memory; or the memory 103 is a DRAM (Dynamic Random Access Memory), etc.

In some implementations, the controller 104 is further coupled to the host 101. The controller 104 can manage the data stored in the memory 103 and communicate with the host 101.

In a possible implementation, the controller 104 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc.

In a possible implementation, the controller 104 is designed for operating in a high duty-cycle environment such as solid state disk (SSD) or embedded multi Media Card (eMMC). SSDs or eMMCs are used as data storages and enterprise memory arrays of the mobile devices such as smart phones, tablet computers and laptop computers.

The controller 104 can be configured to control operations of the memory 103, such as read, erase, and program operations. The controller 104 can also be configured to manage various functions with respect to the data stored or to be stored in the memory 103 including, but not limited to bad-block management, garbage collection, logical-to-physical address conversion, wear leveling, etc. In a possible implementation, the controller 104 is further configured to process error correction codes (ECCs) with respect to the data read from or written to the memory 103.

Any other suitable functions may be performed by the controller 104 as well, for example, formatting the memory 103. The controller 104 can communicate with an external device (e.g., the host 101) according to a particular communication protocol. For example, the controller 104 may communicate with the external device through at least one of various interface protocols, such as a USB protocol, an MMC (Multi Media Card) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small drive interface (ESDI) protocol, an integrated drive electronics (IDE) protocol, a Firewire protocol, and a NVMe (Non-Volatile Memory express) protocol, etc.

The controller 104 and one or more memories 103 can be integrated into various types of memory systems 102, for example, be included in the same package, such as a universal Flash storage (UFS) package or an eMMC package. That is, the memory system 102 can be implemented and packaged into different types of end electronic products.

Figure 2:
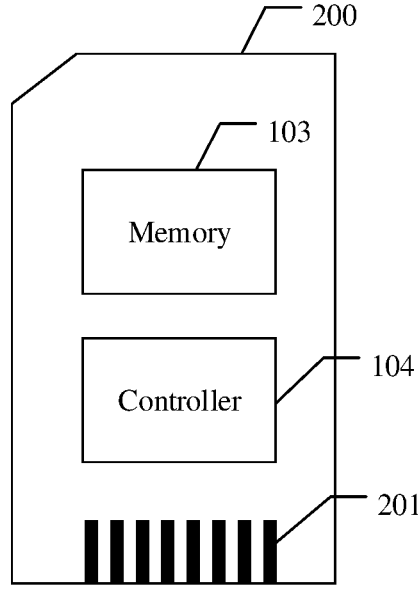
FIG. 2 is a structure diagram of a memory card provided in an implementation of the present disclosure.

Illustratively, as shown in FIG. 2, the controller 104 and a single memory 103 can be integrated into a memory card 200. The memory card 200 may include a PC card (Personal Computer Memory Card International Association, PCM-CIA, PC for short), a CF card, a smart media (SM) card, a memory stick, a multimedia card (MMC, RS-MMC (Reduced-Size MMC), MMCmicro)), a SD card (SD, miniSD (mini secure digital memory card), microSD (micro secure digital memory card), SDHC (Secure Digital High Capacity)), and UFS, etc. The memory card 200 may also include a memory card connector 201 coupling the memory card 200 and the host (e.g., the host 101 in FIG. 1).

Figure 3:
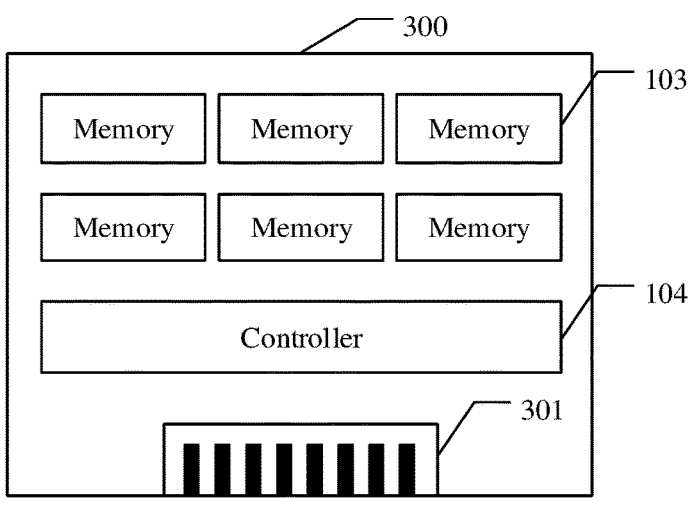
FIG. 3 is a structure diagram of a solid-state drive provided in an implementation of the present disclosure.

Illustratively, as shown in FIG. 3, the controller 104 and a plurality of memories 103 can be integrated into a solid-state disk (also known as solid state drive) 300. The solid-state disk 300 may also include a solid state disk connector 301 coupling the solid state disk 300 and the host (e.g., the host 101 in FIG. 1). In a possible implementation, the memory capacity and/or operating speed of the solid-state disk 300 are greater than the memory capacity and/or operating speed of the memory card 200.

Figure 4:
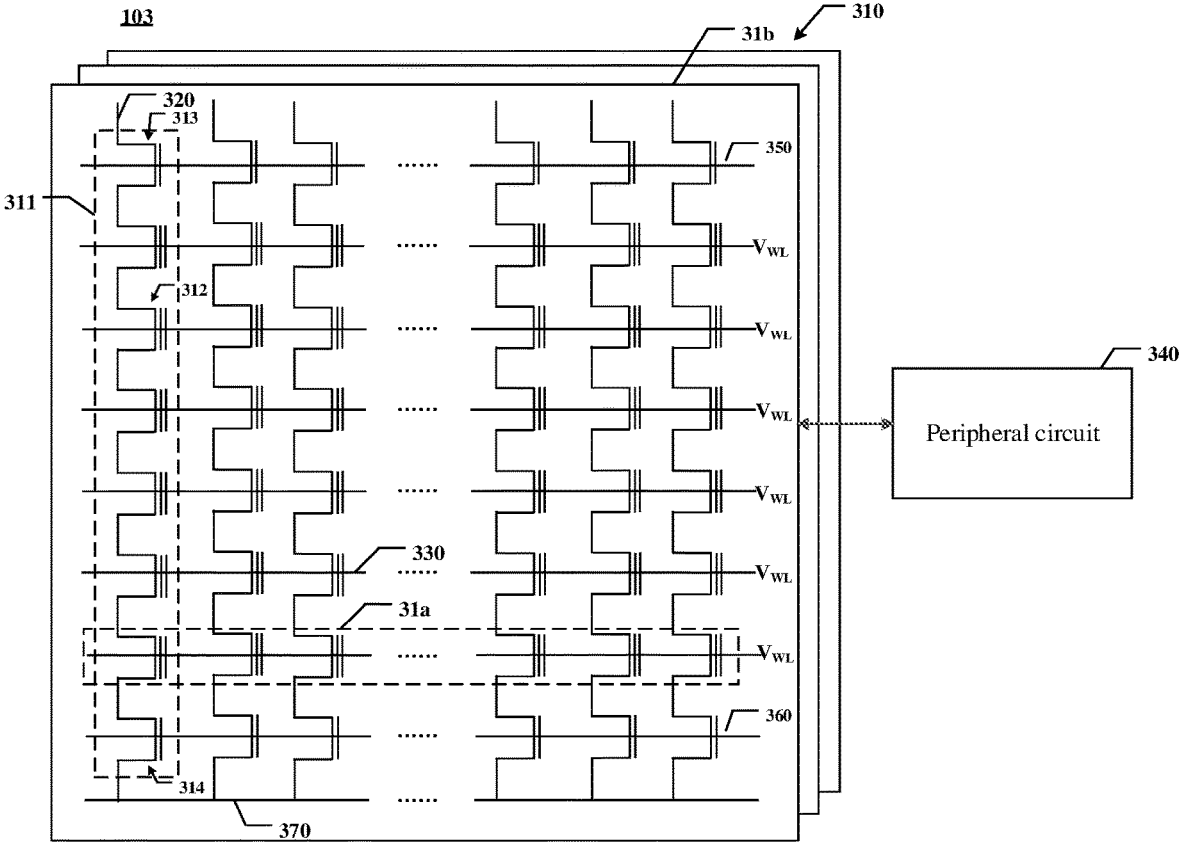
FIG. 4 is a structure diagram of a memory provided in an implementation of the present disclosure.

FIG. 4 shows a diagram of a memory provided in an implementation of the present disclosure. As shown in FIG. 4, the memory 103 includes a memory array 310 and a peripheral circuit 340 communicatively connected with the memory array 310.

Herein, the memory array 310 includes a plurality of memory strings 311 arranged in an array and located on the carrying side of the substrate (not shown) and extending in a direction perpendicular to the carrying side of the sub-strate. Illustratively, the substrate carrying side refers to the surface of the substrate for carrying memory array 310.

Each memory string 311 includes a plurality of memory cells 312 stacked in the direction perpendicular to the substrate carrying side, wherein each memory cell 312 functions to store data. The stored data is dependent on the number of electrons stored by the memory cell 312, which can determine the magnitude of threshold voltage of the memory cell 312. Therefore, the threshold voltage of a memory cell 312 can indicate data stored therein. The memory cell 312 is a floating gate field effect transistor or a charge trap field effect transistor.

Illustratively, the memory cell 312 may be a single level cell (SLC), a multi-level cell (MLC), a triple level cell (TLC) or a quad level cell (QLC). A SLC, MLC, TLC and QLC can store 1, 2, 3 and 4 bits of data respectively.

Each memory string 311 further includes an upper select transistor 313 and a lower select transistor 314. Upper select transistors 313 at the same or similar heights from the substrate carrying side in different memory strings 311 are coupled to the same drain select line (DSL) 350. Lower select transistors 314 at the same or similar heights from the substrate carrying side in different memory strings 311 are coupled to the same source select line (SSL) 360, wherein the upper select transistor 313 and the lower select transistor 314 are used to activate selected memory strings while erasing, programming or erasing memory cells. The upper select transistor 313 is also referred to as the top select gate (TSG), and the lower select transistor 314 is also referred to as the bottom select gate (BSG). In some implementations, there are also dummy cells (DCs) between the upper select transistor 313 and the memory cells 312 and between the lower select transistor 314 and the memory cells 312.

One end of the memory string 311 is coupled to a bit line (BL) 320, and the other end of the memory string 311 is coupled to the source line (SL) 370.

Memory cells 312 at the same or similar heights from the substrate carrying side in different memory strings 311 are in the same layer. A plurality of memory cells 312 in the same layer form a memory cell row 31a. That is, the memory array 310 includes a plurality of memory cell rows and a plurality of word lines (WL) 330 are coupled to the plurality of memory cell rows respectively. All memory strings 311 in a memory array 310 that share the same group of word lines form a block 31b. In some implementations, sources of memory strings 311 in the same block 31b are all coupled to the same source line 370 that is also referred to as the common source line (CSL). In other words, memory strings 311 in the same block 31b have an array common source (ACS).

Peripheral circuit 340 may be coupled to the memory array 310 via the drain select line 350, the source select line 360, the bit line 320, the source line 370 and the word line 330. The peripheral circuit 340 may include any suitable analog, digital and hybrid signal circuits for facilitating operation of the memory array 310 by applying voltage signals and/or current signals to memory cell 312 via the drain select line 350, the source select line 360, the bit line 320, the source line 370 and the word line 330 and sensing voltage signals and/or current signals from the memory cell 312.

The peripheral circuit 340 may include various types of peripheral circuits formed by metal-oxide-semiconductor (MOS) technology. The peripheral circuit 340 can control memory cells in a selected memory string by controlling the voltage $V_{WL}$ on the word line 330 coupled with the selected memory string and the voltage $V_{BL}$ on the bit line coupled with the selected memory string to implement operations such as erasing, programming (also referred to as writing), reading or verifying. In implementations of the present disclosure, the peripheral circuit 340 include a bit line discharge circuit for discharging a bit line coupled to the bit line discharge circuit. Illustratively, the peripheral circuit 340 further include a control logic unit that can control the bit line discharge circuit to implement the operation method of memory provided in implementations of the present disclosure. Of course, in some implementations, it is also possible to control the bit line discharge circuit by the controller 104 to implement the operation method of memory provided in implementations of the present disclosure.

With the development of memory technology, memories are applied more and more. Memories support various operations such as reading, programming (also known as writing), erasing and bit line discharging. Among them, the bit line discharging operation of a memory functions to discharge bit lines applied with a high voltage.

For example, in the process of erasing a memory, a high voltage needs to be applied to bit lines coupled with the memory string to be erased to draw electrons stored in memory cells in the memory string to be erased into the channel with the attraction of the high voltage, thereby realizing data erasure. After the erasure is finished, bit lines coupled with the memory strings that have been erased need to be discharged to prevent the high voltage on the bit lines coupled with the erased memory strings from suppressing subsequent programming operations.

As another example, in the programming process of a memory, a high voltage needs to be applied to the bit line coupled with the non-programming memory string in the current programming process to increase the channel poten-tial of the non-programming memory string and reduce the likelihood of programming the non-programming memory string. After the programming is finished, the bit line coupled with the non-programming memory string needs to be discharged to prevent the high voltage on the bit line coupled with the non-programming memory string from suppressing subsequent programming operations on the memory string.

In some devices, the bit line is discharged to 0V by connecting the bit line directly to the ground. For this discharging process, the discharging speed is not control-lable, and the discharging stability of the bit line is poor. In case of a high discharging speed of the bit line, it is possible to cause abnormal operation of the circuits. For example, the bit line is close to the TSG, if the bit line discharging speed is high, it is possible to couple the TSG to a negative voltage. A TSG of negative voltage might trigger circuit opening of parasitic NPN so as to drain currents from VDDX (a power source), resulting in decreasing of VDDX. The decreasing of VDDX might cause wrong triggering of the drivers of non-selected blocks, such that the voltages of bit lines coupled with the non-selected blocks leak from a high voltage to 0V, thereby leading to the first-time reading problem. Accordingly, it is necessary to provide a memory and an operation method thereof that can improve stability of bit line discharging.

Figure 5:
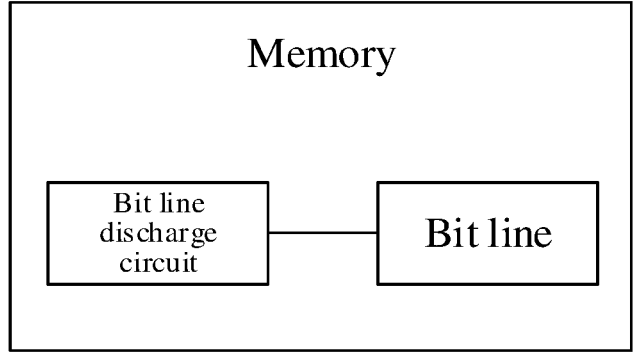
FIG. 5 is a structure diagram of a memory provided in an implementation of the present disclosure.

An implementation of the present disclosure provides a memory. As shown in FIG. 5, the memory includes a bit line discharge circuit and a bit line coupled to the bit line discharge circuit. The bit line discharge circuit is configured to perform controllable discharge on the bit lines to improve stability of bit line discharge, which in turn improves operation stability of the memory in the bit line discharge process. Illustratively, the bit line discharge circuit is included in peripheral circuit 340. The bit line coupled to the bit line discharge circuit may be any bit line that needs discharge in the memory array 310, e.g., the bit line coupled with the memory string to be erased, the bit line coupled with the non-programming memory string, etc. In some implementations, coupling may also be referred to as connecting and the like.

Figure 6:
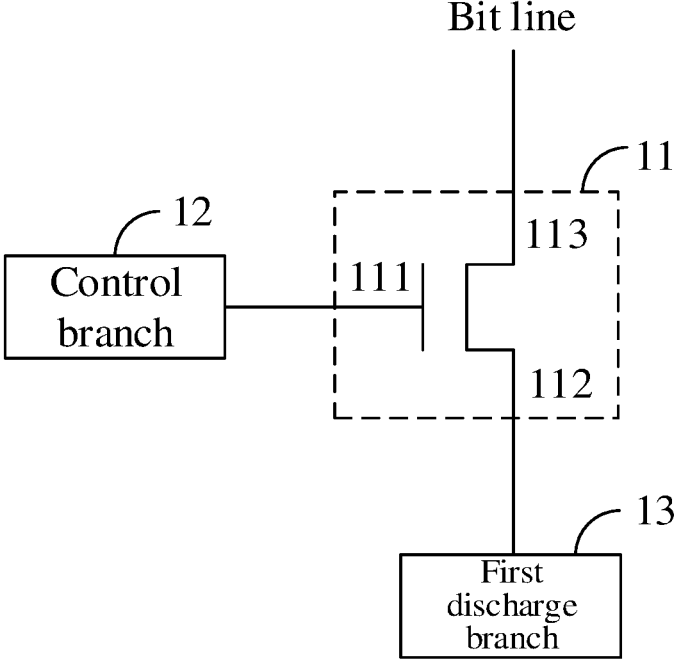
FIG. 6 is a structure diagram of a memory provided in an implementation of the present disclosure.

Referring to FIG. 6, the bit line discharge circuit includes a transistor 11, a control branch 12 and a first discharge branch 13. The gate 111 of transistor 11 is connected with the control branch 12, one 112 of the source and drain of transistor 11 is connected with the first discharge branch 13, the other 113 of the source and drain of transistor 11 is connected with the bit line. Illustratively, the source of transistor 11 is connected with the first discharge branch 13, the drain of transistor 11 is connected with the bit line; alternatively, the drain of transistor 11 is connected with the first discharge branch 13 and the source of transistor 11 is connected with the bit line.

The type of transistor 11 is not limited in implementations of the present disclosure. Illustratively, the transistor 11 is a HV MOS (High Voltage Metal-Oxide-Semiconductor) transistor to guarantee the transistor 11 to withstand high voltage.

The control branch 12 is configured to turn on the transistor 11 to connect the bit line with the first discharge branch 13 via the on transistor 11; and the first discharge branch 13 is configured to discharge the bit line at a set discharge speed while the transistor 11 is turned on. The set discharge speed is the one set in advance before discharging the bit line. Discharging the bit line at the set discharge speed allows controllable discharging of the bit line and improves stability of bit line discharge. The set discharge speed may be set according to experience, and may also be adjusted flexibly according to application scenarios, which is not limited in implementations of the present disclosure.

The discharge speed may be used to measure the voltage drop value per unit time, which may be 1 second, 1 minute, etc. Illustratively, the discharge speed may be constrained by the discharge current on the first discharge branch 13. The discharge speed is in positive correlation with the discharge current. That is, the larger the discharge current is, the larger the discharge speed is, and the smaller the discharge current is, the smaller the discharge speed is. Accordingly, it is possible to set the discharge current on the first discharge branch 13 to a certain fixed discharge current to set the discharge speed of the bit line to a certain fixed discharge speed. The specific correlation between the discharge current and the discharge speed is relevant to the resistance of the first discharge branch 13 and the resistance of the bit line and will not be limited in implementations of the present disclosure.

The first discharge branch 13 is a branch that allows the bit line to discharge at a set discharge speed and its structure may be set flexibly according to practical demands. Illustratively, the first discharge branch 13 may be a structure having a current mirror that can set a pre-set current as the discharge current for discharging in a mirroring manner.

Figure 7:
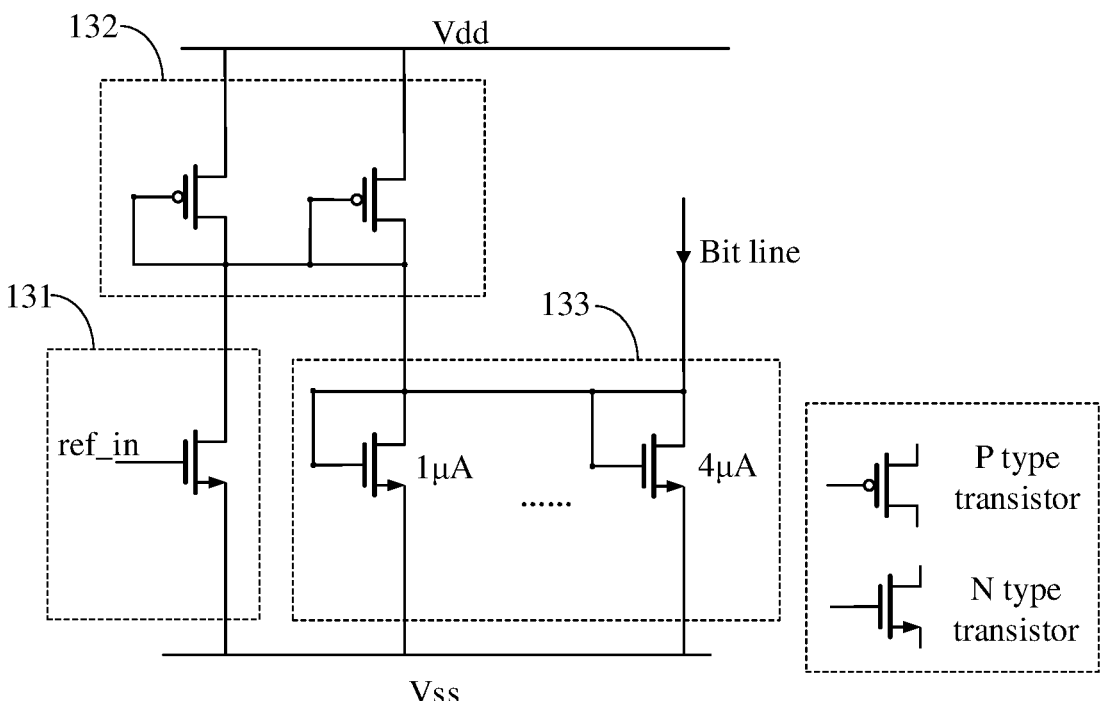
FIG. 7 is a structure diagram of a first discharge branch provided in an implementation of the present disclosure.

Illustratively, the structure of the first discharge branch 13 may be as shown in FIG. 7. The first discharge branch 13 includes a current input branch 131, a mirror branch 132 and a current setting branch 133, wherein the current input branch 131 may include a N type transistor, and a reference voltage (ref_in) is applied to the gate of the N type transistor to generate a certain current between the source and drain of the N type transistor. The mirror branch 132 includes two P type transistors connected with the supply voltage (Vdd). The P type transistor connected in series with the current input branch 131 is configured to transmit the current generated by the current input branch 131 to the branch in which the other P type transistor is located in a mirroring manner. The current setting branch 133 may include a plurality of current setting sub-branches and different current setting sub-branches are configured to set the currents generated by the current input branch 131 to different currents.

For example, the current setting branch 133 shown in FIG. 7 includes a current setting sub-branch that sets the current generated by the current input branch 131 to 1 μA and a current setting sub-branch that sets the current generated by the current input branch 131 to 4 μA. It is possible to select current setting sub-branch flexibly for the bit line to be discharged according to the discharge speed required for discharging the bit line and then discharge the bit line voltage step by step to the target voltage under the constraint of the discharge current in the connected current setting sub-branch. For example, the target voltage is the ground voltage (0V). It is to be noted that FIG. 7 only shows an example structure of the first discharge branch 13 and implementations of the present disclosure are not limited thereto. In example implementations, the first discharge branch 13 may also include a discharge speed constraining module for discharging voltage on the connected line at a set discharge speed.

Illustratively, the set discharge speed may maintain constant or may vary in the bit line discharge process, which is not limited in implementations of the present disclosure.

Figure 8:
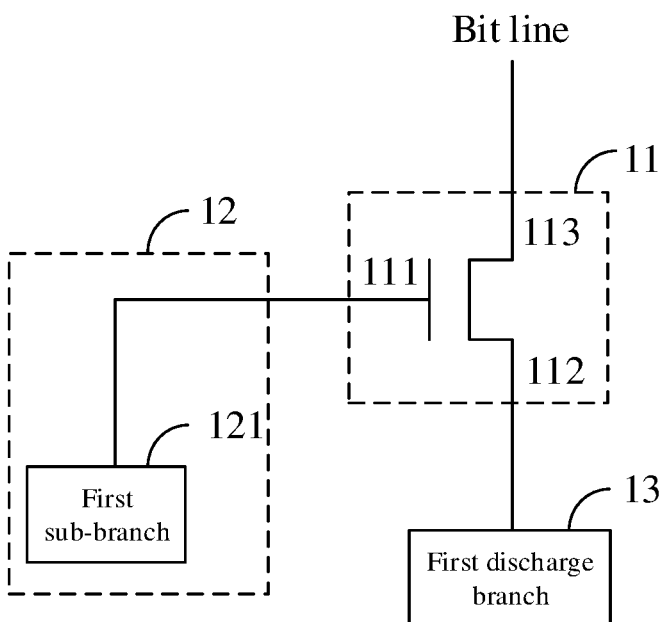
FIG. 8 is a structure diagram of a memory provided in an implementation of the present disclosure.

In example implementations, referring to FIG. 8, the control branch 12 includes a first sub-branch 121. Illustratively, the first sub-branch 121 is configured to apply a second voltage on the gate 111 of the transistor 11. The second voltage is greater than the threshold voltage of the transistor 11. That is, the first sub-branch 12 is configured to apply a voltage greater than the threshold voltage of the transistor 11 on the gate of the transistor 11 to turn on the transistor 11. The second voltage may be set flexibly according to practical demands. For example, the second voltage is a fixed voltage greater than the threshold voltage of the transistor 11 by a specified value. As another example, the second voltage is a voltage that decreases constantly with the elapse of discharge time but is always greater than the threshold voltage of the transistor 11.

In an example implementation, the first sub-branch 121 is configured to apply a second voltage on the gate 111 of the transistor 11 when the voltage on the bit line has not reached the target voltage. The target voltage is the voltage that the bit line needs to be discharged to. For example, the target voltage is 0V or 0.5V, etc. In this case, before the voltage on the bit line is discharged to the target voltage, i.e., before the bit line discharge is finished, the transistor 11 is always turned on, thereby always discharging the bit line at the set discharge speed via the first discharge branch 13. The bit line discharge process may not rely on other discharge branches, which facilitates simplifying the structure of the bit line discharge circuit.

In an example implementation, the first sub-branch 121 is configured to apply a second voltage on the gate 111 of the transistor 11 when the voltage on the bit line is not smaller than the first voltage, wherein the first voltage is greater than the target voltage to which the bit line needs to be discharged. For example, the target voltage is 0V and the first voltage is IV. In this case, the transistor 11 is turned on before the voltage on the bit line is discharged to the first voltage, that is, the bit line is discharged at the set discharge speed via the first discharge branch 13 before the voltage on the bit line is discharged to the first voltage. After the voltage on the bit line is discharged to the first voltage, since the voltage on the bit line is small, it is difficult to maintain the set discharge speed and the discharge speed might decrease, leading to a too long time for the voltage on the bit line to be discharged to the target voltage. Therefore, it is possible to continue discharging with another discharge branch having a greater discharge speed. The structure of the discharge circuit that supports this discharge process will be introduced hereinbelow and will not be set forth here.

Figure 9:
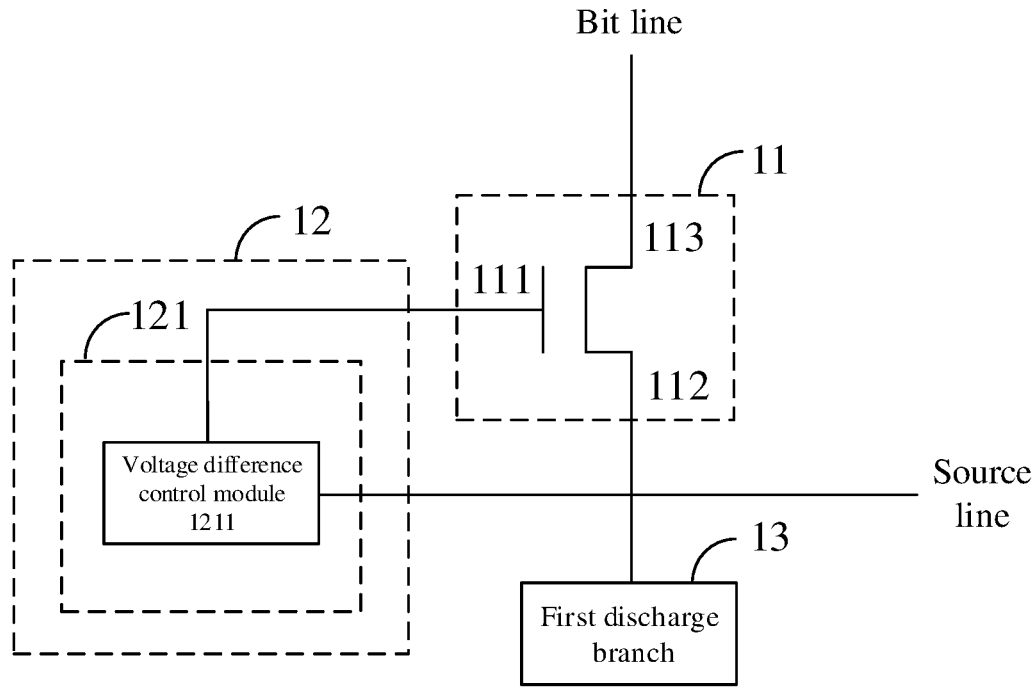
FIG. 9 is a structure diagram of a memory provided in an implementation of the present disclosure.

In an example implementation, referring to FIG. 9, the memory further includes a source line and the first sub-branch 121 includes a voltage difference control module 1211 connected in series between the gate 111 of the transistor 11 and the source line. In this structure, the first sub-branch 121 is configured to apply the second voltage output from the voltage difference control module 1211 to the gate 111 of the transistor 11, wherein the voltage difference between the second voltage and the voltage on the source line is the reference voltage and the source line and the bit line are coupled at two ends of the same memory string in the memory.

Illustratively, the first sub-branch 121 is configured to apply the second voltage output from the voltage difference control module 1211 to the gate 111 of the transistor 11 when the voltage on the bit line has not reached the target voltage or apply the second voltage output from the voltage difference control module 1211 to the gate 111 of the transistor 11 when the voltage on the bit line is not smaller than the first voltage.

By the way of turning on the transistor 11 based on the voltage difference control module 1211, the voltage applied to the gate 111 of the transistor 11 may be one gradually decreasing with the voltage on the source line, which facilitates saving power resource and reduce resource waste, also facilitates improving the transformation stability of the voltage applied on the gate 111 in the process from turning on the transistor 11 to turning off the transistor 11.

The voltage difference control module 1211 is a module that maintains the voltage difference between the output voltage and the voltage on the connected source line as the reference voltage. The reference voltage may be set according to experience or adjusted according to experiment results. For example, the reference voltage may be 6-7V.

When the first sub-branch 121 includes the voltage difference control module 1211, the second voltage applied on the gate 111 of the transistor 11 is the voltage output from the voltage difference control module 1211. That is, the process of turning on the transistor 11 is implemented with the voltage difference control module 1211.

Figure 10:
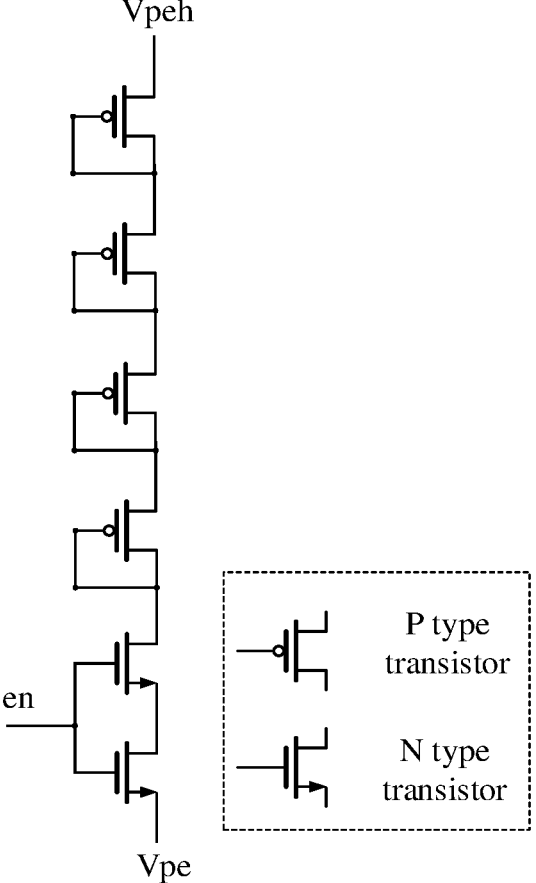
FIG. 10 is a structure diagram of a voltage difference control module provided in an implementation of the present disclosure.

The structure of the voltage difference control module 1211 may be set according to experience, and may also be adjusted flexibly according to application demands, which is not limited in implementations of the present disclosure. Illustratively, the structure of the voltage difference control module 1211 may be as shown in FIG. 10. The voltage difference control module 1211 includes a plurality of P type transistors connected in series for controlling to turn on the circuit when the difference between the voltage at the output (Vpeh) and the voltage at the input (Vpe) reaches the reference voltage. The voltage difference control module 1211 is connected in series between the gate 111 of the transistor 11 and the source line. The voltage at the output of the voltage difference control module 1211 is the voltage to be applied to the gate 111 of the transistor 11 and the voltage at the input of the voltage difference control module 1211 is the voltage on the source line.

As can be seen in FIG. 10, the voltage difference control module 1211 further includes an enable (en) circuit for controlling the timing of connecting in series the voltage difference control module 1211 between the gate 111 of the transistor 11 and the source line. For example, the voltage difference control module 1211 is connected in series between the gate 111 of the transistor 11 and the source line by applying a large voltage on the enable circuit to turn on the N type transistor in the enable circuit.

In an example implementation, it is possible to initially apply a large voltage, e.g., 20V at the output of the voltage difference control module 1211 in use and it is assumed that the initial voltage on the source line is 18V and the reference voltage is 7V. At the initial time, the difference between the voltage at the output and the voltage on the source line has not reached the reference voltage, the circuit in the voltage difference control module 1211 is not turned on, and the voltage at the output (e.g., 20V) is applied on the gate 111 of the transistor 11. The voltage on the source line may be gradually decreased by discharging. When the voltage on the source line is decreased to 13V, the voltage difference between the voltage at the output and the voltage on the source line reaches the reference voltage and the circuit in the voltage difference control module 1211 is turned on. Thereafter, the voltage at the output gradually drops as the drop of the voltage on the source line while maintaining the voltage difference of the reference voltage until before the voltage on the source line drops to a value that cannot turn on the transistor 11 even if the reference voltage is increased. The first sub-branch 121 is disabled in time, for example, the voltage difference control module 1211 and the source line are disconnected.

Figure 11:
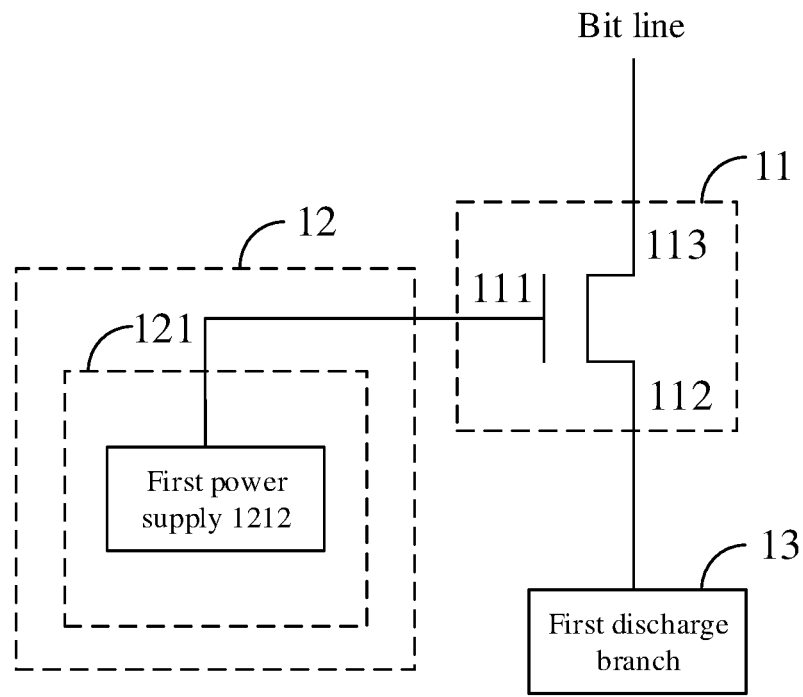
FIG. 11 is a structure diagram of a memory provided in an implementation of the present disclosure.

In an example implementation, referring to FIG. 11, the first sub-branch 121 includes a first power supply 1212 connected with the gate 111 of the transistor 11. In this structure, the first sub-branch 121 is configured to apply the second voltage provided by the first power supply 1212 to the gate 111 of the transistor 11. Illustratively, the first sub-branch 121 is configured to apply the second voltage provided by the first power supply 1212 to the gate 111 of the transistor 11 when the voltage on the bit line has not reached the target voltage or apply the second voltage provided by the first power supply 1212 to the gate 111 of the transistor 11 when the voltage on the bit line is not smaller than the first voltage. The first power supply 1212 is a power supply for providing the second voltage. In the way of turning on the transistor 11 based on the first power supply 1212, the voltage applied to the gate 111 of the transistor 11 is a fixed voltage and the control logic is simple.

Figure 12:
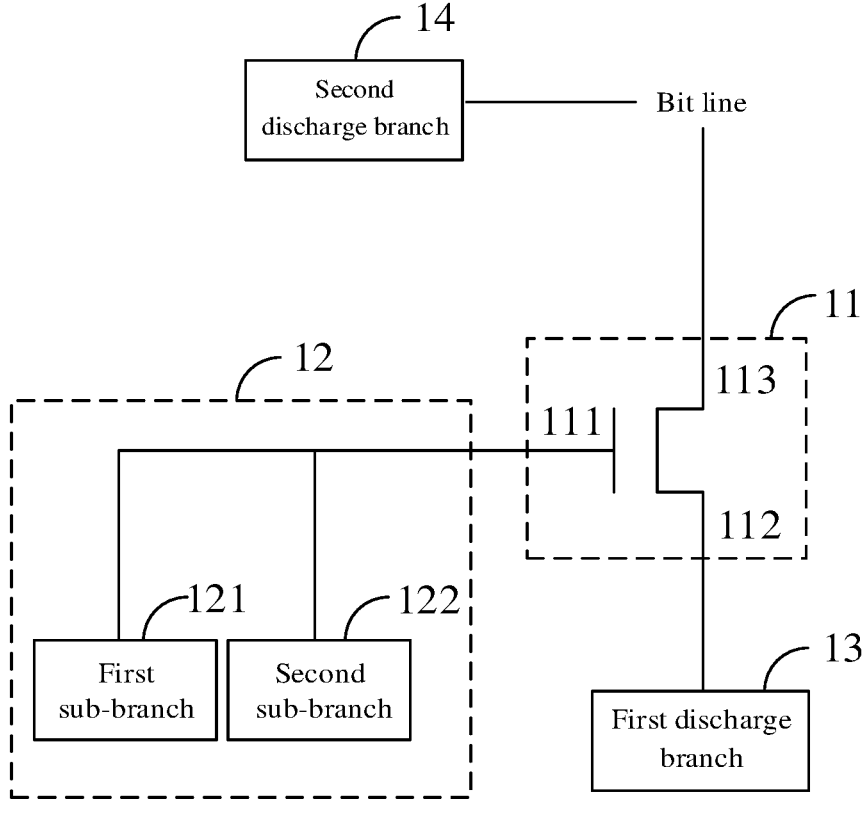
FIG. 12 is a structure diagram of a memory provided in an implementation of the present disclosure.

In an example implementation, referring to FIG. 12, when the first sub-branch 121 is configured to apply a second voltage on the gate 111 of the transistor 11 when the voltage on the bit line is not smaller than the first voltage, the control branch 12 further includes a second sub-branch 122 and the bit line discharge circuit further includes a second discharge branch 14 connected with the bit line, wherein the second sub-branch 122 is configured to apply a third voltage on the gate 111 of the transistor 11 when the voltage on the bit line is smaller than the first voltage, wherein the third voltage is smaller than the threshold voltage of the transistor 11. The second discharge branch 14 is configured to discharge the voltage on the bit line to the target voltage in case the third voltage is applied to the gate 111 of the transistor 11. When the voltage on the bit line is smaller than the first voltage, the second discharge branch 14 discharges the bit line at a speed greater than the speed at which the first discharge branch 13 discharges the bit line.

Since the third voltage is smaller than the threshold voltage of the transistor 11, applying the third voltage to the gate 111 of the transistor 11 can turn off the transistor 11. That is, the second sub-branch 122 is configured to turn off the transistor 11 when the voltage on the bit line is smaller than the first voltage. The third voltage may be set according to experience, and may also be adjusted flexibly according to application demands. For example, when the threshold voltage of the transistor 11 is a positive voltage, the third voltage may be the ground voltage (0V) to guarantee that the transistor 11 may be turned off reliably and power resource may be saved.

Figure 13:
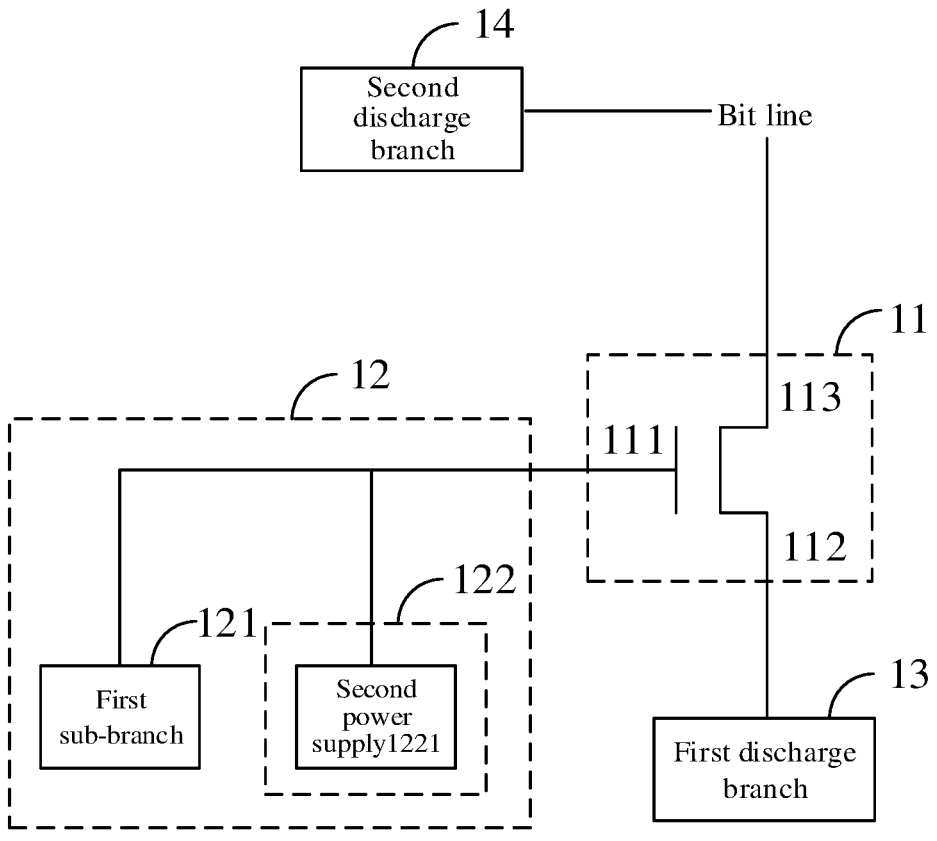
FIG. 13 is a structure diagram of a memory provided in an implementation of the present disclosure.

Illustratively, referring to FIG. 13, the second sub-branch 122 includes a second power supply 1221 connected with the gate 111 of the transistor 11. In this structure, the second sub-branch 122 is configured to apply the third voltage provided by the second power supply 1221 to the gate 111 of the transistor 11 when the voltage on the bit line is smaller than the first voltage. The second power supply 1221 is a power supply for providing the third voltage. For example, the second power supply 1221 is a grounding power supply and the third voltage is 0V. In the way of turning off the transistor 11 based on the second power supply 1221, the voltage applied to the gate 111 of the transistor 11 is a fixed voltage and the control logic is simple.

When the third voltage is applied to the gate 111 of the transistor 11, the transistor 11 is turned off. At this time, the first discharge branch 13 is no longer connected with the bit line. That is, the bit line is no longer discharged with the first discharge branch 13 but discharged with the second discharge branch 14 having a greater discharge speed instead, thereby guaranteeing the discharge efficiency of discharging the bit line from the first voltage to the target voltage and avoiding too long a discharge time.

Figure 14:
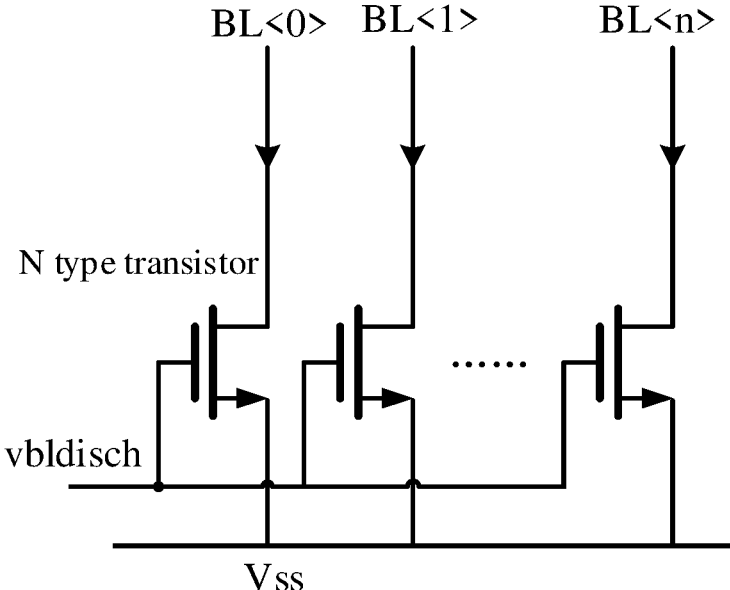
FIG. 14 is a structure diagram of a second discharge branch provided in an implementation of the present disclosure.

The structure of the second discharge branch 14 may be set according to experience, and may also be adjusted flexibly according to application demands, which are not limited to implementations of the present disclosure. Illustratively, the structure of the second discharge branch 14 may be as shown in FIG. 14. The second discharge branch 14 includes a plurality of sub-branches to be connected with different bit lines (BLs). Each sub-branch includes an N type transistor with a gate connected with the bit line discharge switch (vbldisch), and one of its source and drain connected with the bit line and the other connected with the grounding power supply (Vss). While the bit line needs to be discharged, the bit line is connected with the source or drain of the N type transistor in any sub-branch and the N type transistor in the sub-branch is turned on via the bit line discharge switch such that the bit line is connected to the grounding power supply via the turned on N type transistor, which in turn allows the bit line to be discharged to the 0V voltage provided by the grounding power supply. Discharging the bit line by connecting directly to the grounding power supply has a discharge speed large and greater than the set discharge speed in the first discharge branch 13.

In an example implementation, one 112 of the source and drain of the transistor 11 being connected with the first discharge branch 13 might mean that one 112 of the source and drain of the transistor 11 is directly connected with the first discharge branch 13, that is, no other structure exists between one 112 of the source and drain of the transistor 11 and the first discharge branch 13. In this case, it is possible to discharge the bit line at the set discharge speed directly with the first discharge branch 13.

Figure 15:
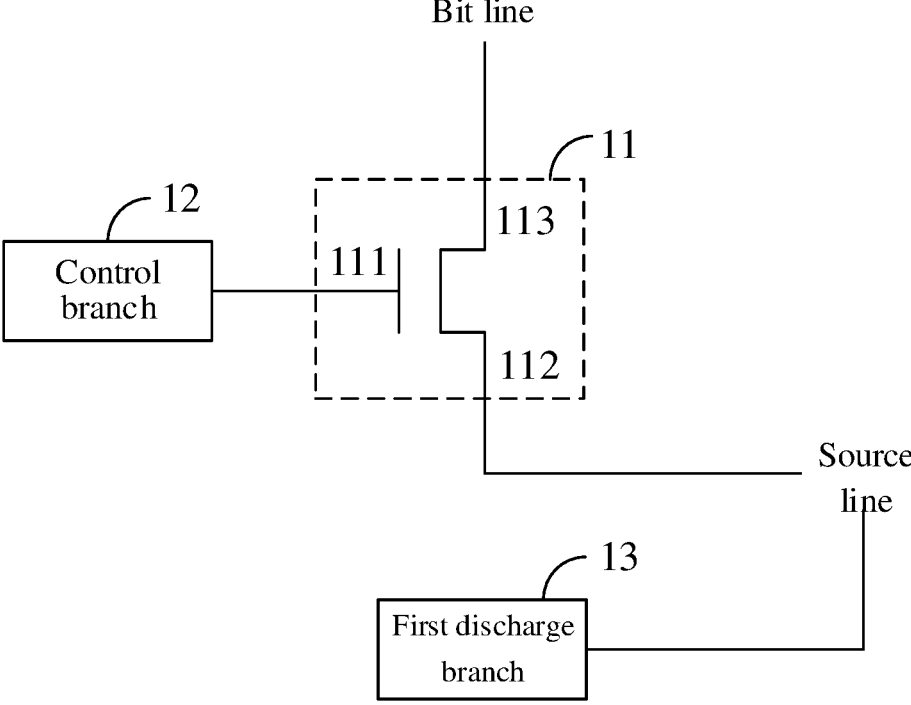
FIG. 15 is a structure diagram of a memory provided in an implementation of the present disclosure.

In an example implementation, one 112 of the source and drain of the transistor 11 being connected with the first discharge branch 13 might also mean that one 112 of the source and drain of the transistor 11 is indirectly connected with the first discharge branch 13, that is, one 112 of the source and drain of the transistor 11 is connected with the first discharge branch 13 via another structure. The another structure may be selected flexibly according to practical demands. Illustratively, the another structure may be the source line coupled at two ends of the same memory string with the bit line. That is, one 112 of the source and drain of the transistor 11 is connected with the first discharge branch 13 via the source line. In other words, as shown in FIG. 15, one 112 of the source and drain of the transistor 11 is directly connected with the source line, the source line is directly connected with the first discharge branch 13, but one 112 of the source and drain of the transistor 11 is not directly connected with the first discharge branch 13.

Figure 16:
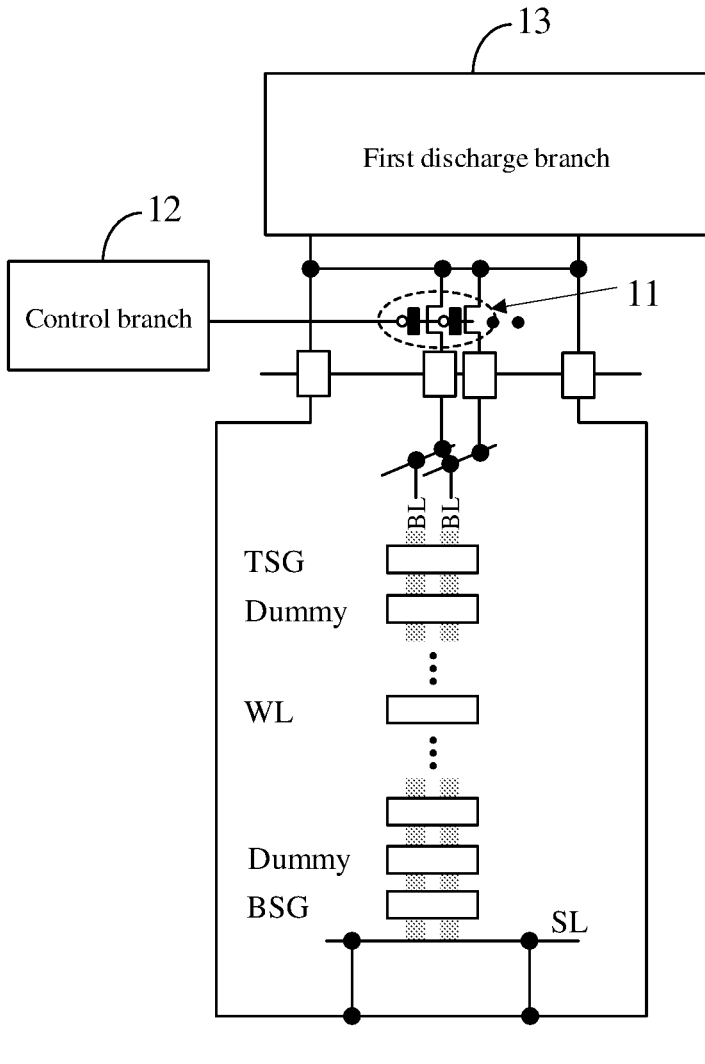
FIG. 16 is a structure diagram of a memory provided in an implementation of the present disclosure.

It is to be noted that when one 112 of the source and drain of the transistor 11 is directly connected with the first discharge branch 13, the first discharge branch 13 may also be directly connected with the source line. That is, the first discharge branch 13 can not only discharge the bit line at the set discharge speed, but also discharge the source line at the set discharge speed. It is to be further noted that the number of transistors 11 may be plurality and one of the source and drain of each transistor 11 is configured to be connected with one bit line. For example, as shown in FIG. 16, the number of transistors 11 is plurality, the gate of each transistor 11 is connected with the control branch 12, one of the source and drain of each transistor 11 is connected with one bit line (BL), and the other of the source and drain of each transistor 11 is connected with the first discharge branch 13. Furthermore, the first discharge branch 13 is further connected with the source line (SL) common to a plurality of memory strings.

Illustratively, the bit line discharge circuit may further include some switches to control the connection states of some branches by controlling on and off of the switches, thereby improving the flexibility of controlling the bit line discharge circuit.

Figure 17:
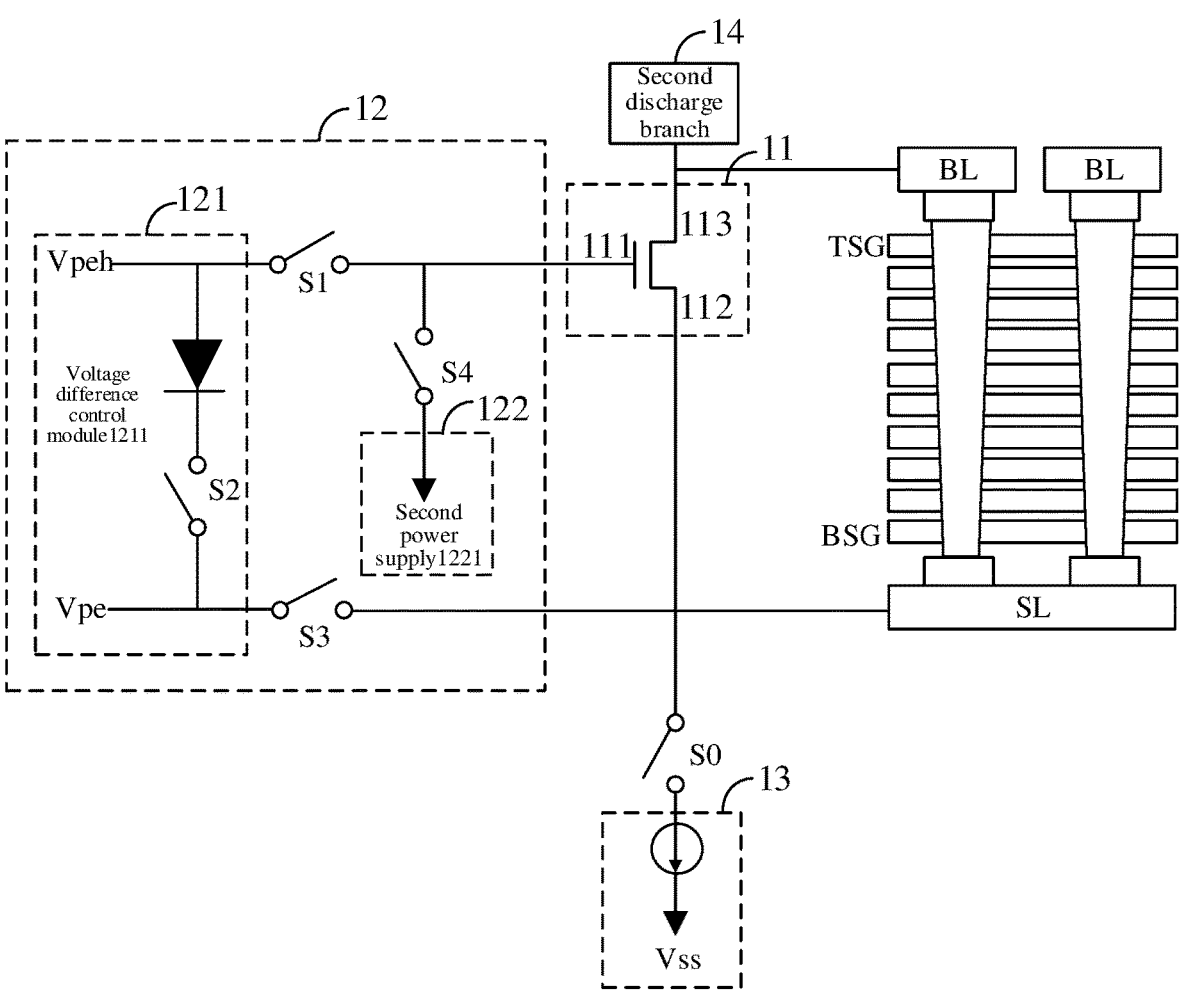
FIG. 17 is a structure diagram of a memory provided in an implementation of the present disclosure.

For example, the structure of the memory may be as shown in FIG. 17 where for example the bit line discharge circuit includes the first discharge branch 13 and the second discharge branch 14, the control branch 12 includes the first sub-branch 121 and the second sub-branch 122, the first sub-branch 121 includes the voltage difference control module 1211, the second sub-branch 122 includes the second power supply 1221, and one 112 of the source and drain of the transistor 11 is directly connected with the first discharge branch 13.

In the structure shown in FIG. 17, in addition to the first sub-branch 121 and the second sub-branch 122, the control branch 12 includes switch S1, switch S3 and switch S4, wherein switch S1 is configured to control whether to connect the first sub-branch 121 including the voltage difference control module 1211 with the gate 111 of the transistor 11, i.e., whether to apply the voltage at the output (Vpeh) of the voltage difference control module 1211 to the gate 111 of the transistor 11; switch S3 is configured to control whether to connect the first sub-branch 121 including the voltage difference control module 1211 with the source line (SL); and switch S4 is configured to control whether to connect the second sub-branch 122 including the second power supply 1221 with the gate 111 of the transistor 11, i.e., whether to apply the third voltage provided by the second power supply 1221 to the gate 111 of the transistor 11. In addition to the voltage difference control module 1211, the first sub-branch 121 further includes switch S2 configured to control whether to transmit the voltage at the input (Vpe) of the voltage difference control module 1211 to the voltage difference control module 1211. The bit line discharge circuit further includes switch S0 configured to control whether to connect the first discharge branch 13 with one 112 of the source and drain of the transistor 11.

Figure 18:
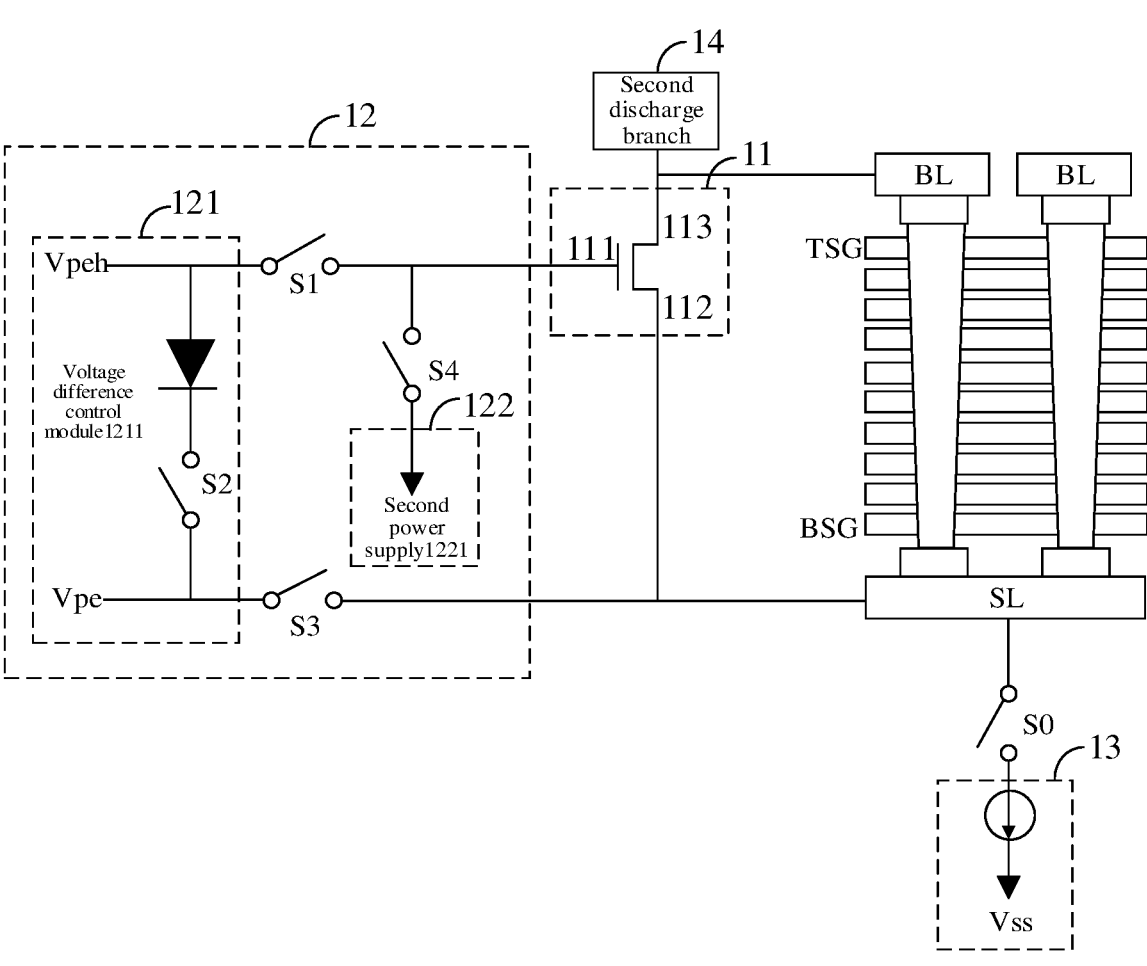
FIG. 18 is a structure diagram of a memory provided in an implementation of the present disclosure.

As another example, the structure of the memory may be as shown in FIG. 18 where for example the bit line discharge circuit includes the first discharge branch 13 and the second discharge branch 14, the control branch 12 includes the first sub-branch 121 and the second sub-branch 122, the first sub-branch 121 includes the voltage difference control module 1211, the second sub-branch 122 includes the second power supply 1221, and one 112 of the source and drain of the transistor 11 is connected with the first discharge branch 13 via the source line.

In the structure shown in FIG. 18, in addition to the first and second sub-branches 121 and 122, the control branch 12 includes switch S1, switch S3 and switch S4, wherein switch S1 is configured to control whether to connect the first sub-branch 121 including the voltage difference control module 1211 with the gate 111 of the transistor 11, i.e., whether to apply the voltage at the output (Vpeh) of the voltage difference control module 1211 to the gate 111 of the transistor 11; switch S3 is configured to control whether to connect the first sub-branch 121 including the voltage difference control module 1211 with the source line (SL); and switch S4 is configured to control whether to connect the second sub-branch 122 including the second power supply 1221 with the gate 111 of the transistor 11, i.e., whether to apply the third voltage provided by the second power supply 1221 to the gate 111 of the transistor 11. In addition to the voltage difference control module 1211, the first sub-branch 121 further includes switch S2 configured to control whether to transmit the voltage at the input (Vpe) of the voltage difference control module 1211 to the voltage difference control module 1211. Furthermore, the bit line discharge circuit further includes switch S0 configured to control whether to connect the first discharge branch 13 with the source line (SL).

In an example implementation, when one 112 of the source and drain of the transistor 11 is connected with the first discharge branch 13, one 112 of the source and drain of the transistor 11 may also be directly connected with the source line, as shown in FIGS. 16 and 17. In this case, if the transistor 11 is turned on, the voltage on the bit line is substantially the same as the voltage on the source. If it is desired to detect the voltage on the source line, it is possible to directly detect the voltage on the source line, or detect the voltage on the bit line as the voltage on the source line. And if it is desired to detect the voltage on the bit line, it is possible to directly detect the voltage on the bit line, or detect the voltage on the source line as the voltage on the bit line.

Illustratively, the source line and the bit line may be connected via the turned on transistor 11, the gate of the transistor 11 and the source line may be connected via the voltage difference control module 1211, and the source line may be connected with the first discharge branch 13 such that the bit line, the source line and the gate 111 of the transistor 11 are discharged with the same discharge current (i.e., the discharge current set in the first discharge branch 13), and it is possible to keep the components in the memory in SOA (Safe Operating Area) rules with a controllable discharge speed. The SOA rules may be set according to experience. For example, SOA rules may include that the voltage Vgs between gate 111 and source of the transistor 11 cannot be greater than 17V and the voltage Vds between the drain and source of the transistor 11 cannot be greater than 4V.

With the memory provided in implementations of the present disclosure, the bit line and the first discharge branch are located at two ends, i.e., source and drain of the transistor and thus can connect the bit line with the first discharge branch via the turned on transistor and in turn discharge the bit line at a set discharge speed with the first discharge branch. The discharge speed of the bit line is controllable, and the stability of the bit line discharge is high, which facilitates improving the operating stability of the memory in the bit line discharge process.

Furthermore, it is possible to discharge the bit line at the set discharge speed with the first discharge branch when the voltage on the bit line is large (e.g., greater than the first voltage) to guarantee the controllability of the bit line discharge; and discharge the bit line at a higher discharge speed with the second discharge branch when the voltage on the bit line is small (e.g., smaller than the first voltage) to increase the discharge speed of the bit line.

The first discharge branch may be connected with one of the source and drain of the transistor directly or indirectly with a high flexibility. The transistor may be turned on based on the voltage difference control module or the first power supply without limitation.

Figure 19:
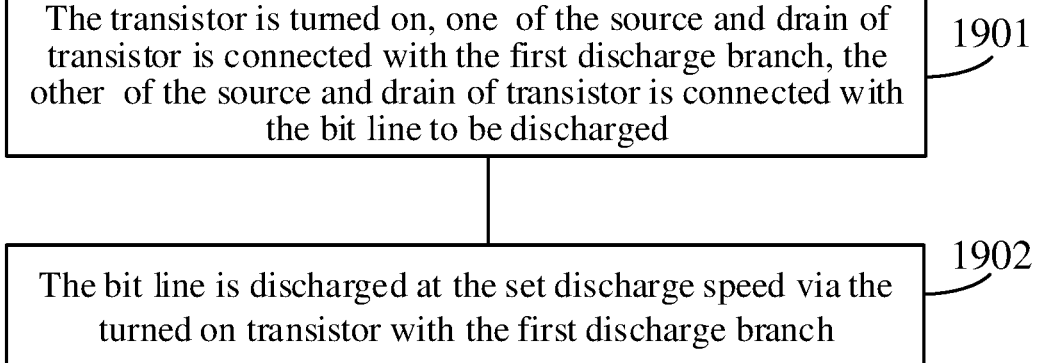
FIG. 19 is a flow chart of a memory operation method provided in an implementation of the present disclosure.

An implementation of the present disclosure further provides an operation method of memory. The memory includes a bit line discharge circuit including a transistor and a first discharge branch and a bit line coupled to the bit line discharge circuit. The operation method of memory is to discharge the bit line in the memory with the bit line discharge circuit. Illustratively, the operation method may be executed by a module that can control the bit line discharge circuit. For example, the module may be the logic control unit in peripheral circuit 340 or the controller 104, etc. As shown in FIG. 19, the memory operation method provided in an implementation of the present disclosure may include the following steps 1901 and 1902.

In step 1901, the transistor 11 is turned on, one 112 of the source and drain of transistor is connected with the first discharge branch, the other of the source and drain of transistor is connected with the bit line.

The first discharge branch is configured to discharge the bit line at a set discharge speed when the transistor is turned on and the introduction thereof is as described in implementations shown in FIGS. 5 to 18 and will not be repeated.

Illustratively, the gate of the transistor is connected with the control branch and the transistor is turned on with the control branch. The control branch, the transistor and the first discharge branch may be in the bit line discharge circuit in the memory and the bit line discharge circuit is configured to discharge the bit line coupled to the bit line discharge circuit.

In a possible implementation, the transistor is turned on by applying a second voltage to the gate of the transistor, wherein the second voltage is greater than the threshold voltage of the transistor. The second voltage may be set flexibly according to practical demands. For example, the second voltage is a fixed voltage greater than the threshold voltage of the transistor by a specified value. As another example, the second voltage is a voltage that decreases constantly with the elapse of discharge time but is always greater than the threshold voltage of the transistor.

In an example implementation, applying the second voltage to the gate of the transistor may be applying the second voltage to the gate of the transistor when the voltage on the bit line has not reached the target voltage; or applying the second voltage to the gate of the transistor when the voltage on the bit line is not smaller than the first voltage, wherein the target voltage is the voltage the bit line needs to be discharged to and the first voltage is greater than the target voltage. For example, the target voltage is 0V and the first voltage is IV.

In one possible implementation, the implementations of applying the second voltage to the gate of the transistor include, but not limited to the following two.

In implementation I, the second voltage output by the voltage difference control module is applied to the gate of the transistor.

This implementation I is realized when the memory further includes source lines, and the bit line discharge circuit further includes a voltage difference control module connected in series between the gate of the transistor and the source line. Herein, the voltage difference between the second voltage and the voltage on the source line is the reference voltage and the source line and the bit line are coupled at two ends of the same memory string.

Illustratively, the control branch for connecting with the gate of the transistor includes a first sub-branch and the voltage difference control module is a module in the first sub-branch. In this case, the second voltage output from the voltage difference control module is applied to the gate of the transistor with the first sub-branch. The introduction of the voltage difference control module is described in detail in implementations shown in FIGS. 5 to 18 and will not be repeated here.

Illustratively, the second voltage output from the voltage difference control module is applied to the gate of the transistor when the voltage on the bit line has not reached the target voltage or the second voltage output from the voltage difference control module is applied to the gate of the transistor when the voltage on the bit line is not smaller than the first voltage.

By the way of turning on the transistor based on the voltage difference control module, the voltage applied to the gate of the transistor may be one gradually decreasing with the voltage on the source line, which facilitates saving power resource and reduce resource waste, also facilitates improving the transformation stability of the voltage applied on the gate in the process from turning on the transistor to turning off the transistor.

In an example implementation, when the second voltage is applied to the gate of the transistor based on the implementation I, the operation method of memory further includes: detecting the voltage on the source line after discharging if the source line is discharged; and disconnecting the voltage difference control module and the source line before the sum of the voltage on the source line after discharging and the reference voltage is smaller than the transistor threshold voltage to guarantee the voltage applied to the gate of the transistor is greater than the transistor threshold voltage.

Since the second voltage applied to the gate of the transistor is the voltage output by the voltage difference control module, and the voltage difference between the output voltage and the voltage on the source line is the reference voltage, if the source line is discharged, i.e., the voltage on the source line decreases constantly, it is necessary to detect the voltage on the source after discharging and calculate the sum of the voltage on the source line after discharging and the reference voltage to check if it can turn on the transistor, and disconnect the voltage difference control module and the source line in time before the sum of the voltage on the source line after discharging and the reference voltage is insufficient to turn on the transistor such that the voltage output from the voltage difference control module no longer decreases with the decreasing of the voltage on the source line and the voltage applied on the gate of the transistor is guaranteed to be greater than the transistor threshold voltage.

Illustratively, the voltage on the source after discharging may be detected at a reference interval that may be set according to experience or adjusted flexibly according to application demands.

The specific timing for disconnecting the voltage difference control module and the source line is not limited in implementations of the present disclosure as long as before the sum of the voltage on the source line after discharging and the reference voltage is insufficient to turn on the transistor. Illustratively, for example, the transistor threshold voltage is 10V and the reference voltage is 7V, then it is possible to disconnect the voltage difference control module and the source line when the voltage on the source line after discharging falls to 4V.

In implementation II, the second voltage provided by the first power supply is applied to the gate of the transistor.

The implementation II is realized when the bit line discharge circuit further includes a first power supply connected with the gate of the transistor.

Illustratively, the control branch for connecting with the gate of the transistor includes a first sub-branch and the first power supply is a module in the first sub-branch. In this case, the second voltage provided by the first power supply is applied to the gate of the transistor with the first sub-branch. The introduction of the first power supply is described in detail in implementations shown in FIGS. 5 to 18 and will not be repeated here. Illustratively, the second voltage provided by the first power supply is applied to the gate of the transistor when the voltage on the bit line has not reached the target voltage or the second voltage provided by the first power supply is applied to the gate of the transistor when the voltage on the bit line is not smaller than the first voltage. The first power supply is a power supply for providing the second voltage. In the way of turning on the transistor based on the first power supply, the voltage applied to the gate of the transistor is a fixed voltage and the control logic is simple.

In step 1902, the bit line is discharged at the set discharge speed via the turned on transistor with the first discharge branch.

After the transistor is turned on, it is conductive between the source and drain of the transistor. Since one of the source and drain of transistor is connected with the first discharge branch, the other of the source and drain of transistor is connected with the bit line, the first discharge branch is connected with the bit line after the transistor is turned on. Further since the first discharge branch is configured to discharge the connected line to be discharged at the set discharge speed, it is possible to discharge the bit line at the set discharge speed via the turned on transistor with the first discharge branch.

In an example implementation, one of the source and drain of the transistor being connected with the first discharge branch may refer to that one of the source and drain of the transistor is directly connected with the first discharge branch, in which case discharging the bit line at the set discharge speed via the turned on transistor with the first discharge branch refers to discharging the bit line at the set discharge speed directly via the turned on transistor with the first discharge branch. This implementation has a high discharge efficiency of bit lines.

In an example implementation, one of the source and drain of the transistor being connected with the first discharge branch might also mean that one of the source and drain of the transistor is indirectly connected with the first discharge branch. That is, the one of the source and drain of the transistor is connected with the first discharge branch via another structure. The another structure may be selected flexibly according to practical demands. Illustratively, the another structure may be the source line coupled at two ends of the same memory string with the bit line. That is, the one of the source and drain of the transistor is connected with the first discharge branch via the source line.

When one of the source and drain of the transistor connected with the first discharge branch via the source line, discharging the bit line at the set discharge speed via the turned on transistor with the first discharge branch refers to discharging the source line at the set discharge speed with the first discharge branch such that the bit line is discharged at the same discharge speed as the source line via the turned on transistor. In this way, it is possible to discharge the bit line indirectly by discharging the source line. That is, the bit line is discharged at the same time as discharging the source line, resulting in high flexibility.

In an example implementation, when applying the second voltage to the gate of the transistor refers to applying the second voltage to the gate of the transistor if the voltage on the bit line is not smaller than the first voltage, the bit line discharge circuit further includes a second discharge branch connected with the bit line and the operation method of memory further includes: applying a third voltage smaller than the transistor threshold voltage to the gate of the transistor when the voltage on the bit line is smaller than the first voltage and discharging the voltage on the bit line to the target voltage with the second discharge branch; wherein when the voltage on the bit line is smaller than the first voltage, the discharge speed at which the bit line is discharged with the second discharge branch is greater than that of the first discharge branch.

Illustratively, in addition to the first sub-branch, the control branch for connecting with the gate of the transistor further includes a second sub-branch that may be used to apply the third voltage to the gate of the transistor when the voltage on the bit line is smaller than the first voltage.

In an example implementation, the bit line discharge circuit further includes a second power supply connected with the gate of the transistor, and the implementation of applying the third voltage to the gate of the transistor when the voltage on the bit line is smaller than the first voltage includes applying the third voltage provided by the second power supply to the gate of the transistor when the voltage on the bit line is smaller than the first voltage. The second power supply is a module in the second sub-branch. Therefore, when the voltage on the bit line is smaller than the first voltage, the third voltage provided by the second power supply is applied to the gate of the transistor with the second sub-branch. In the way of turning off the transistor based on the second power supply, the voltage applied to the gate of the transistor is a fixed voltage and the control logic is simple. The introduction of the second power supply is described in detail in implementations shown in FIGS. 5 to 18 and will not be repeated here.

The second discharge branch is a discharge branch other than the first discharge branch in the bit line discharge circuit and directly connected with the bit line without via a turned on transistor. Therefore, it is possible to discharge the bit line with the second discharge branch when the transistor is turned off, i.e., the voltage applied to the gate of the transistor is smaller than the threshold voltage. When the voltage on the bit line is smaller than the first voltage, the second discharge branch discharges the bit line at a speed greater than the speed at which the first discharge branch discharges the bit line. In this way, it is possible to guarantee the discharge efficiency of discharging the bit line from the first voltage to the target voltage and avoid a too long time for discharging. The introduction of the second discharge branch is described in detail in implementations shown in FIGS. 5 to 18 and will not be repeated here.

Illustratively, the operation method of memory as provided in implementations of the present disclosure may be considered as a method for discharging bit lines in a memory by controlling the bit line discharge circuit in the memory. The operation method of memory will be described with the memory structure shown in FIG. 17 or 18 as an example.

When the memory structure is shown in FIG. 17 or 18, the operation method may include closing switch S0, switch S1, switch S2 and switch S3 such that the voltage difference between the voltage applied to the gate 111 of the transistor 11 and the voltage on the source line (SL) maintains as the reference voltage and the source line, the bit line and the gate 111 of the transistor 11 are all discharged at the set discharge speed via the first discharge branch 13.

After the voltage on the source line has been discharged to 4V (that is, before the sum of the voltage on the source line and the reference voltage is smaller than the threshold voltage of the transistor 11), switch S1, switch S2 and switch S3 are opened to disconnect the voltage difference control module 1211 and the source line, guaranteeing the voltage applied on the gate 111 of the transistor 11 is greater than the threshold voltage of the transistor 11. At this point, the gate 111 of the transistor 11 is in floating state and the transistor can be kept turned on with the voltage coupled with the source line (4V) and the bit line can be discharged with the first discharge branch 13 continuously (discharging the bit line directly or discharging the bit line indirectly by discharging the source line).

When the voltage on the bit line is discharged to IV (i.e., the first voltage), switch S4 is closed to connect the gate 111 of the transistor 11 and the second power supply 1221, thereby disconnecting transistor 11, namely disconnecting the bit line and the first discharge branch 13. At this point, the source line may be discharged continuously with the first discharge branch 13 and the bit line may be discharged continuously with the second discharge branch 14 until to the target voltage (e.g., 0V).

In an example implementation, one of the source and drain of the transistor may be directly connected with the source line. This may occur when one of the source and drain of the transistor is connected with the first discharge branch via the source line, or when one of the source and drain of the transistor is directly connected with the first discharge branch and directly connected with the source line. If one of the source and drain of the transistor is directly connected with the source line, the operation method of memory may further include: controlling the first discharge branch to be in non-operation state and transmitting the voltage on the source line to the bit line via the turned on transistor to force the bit line and the source line to have the same voltage; wherein the source line and the bit line are coupled at two ends of the same memory string.

Since one of the source and drain of the transistor is directly connected with the source line and the other of the source and drain of the transistor is directly connected with the bit line, the source line and the bit line can be connected via the turned on transistor, and if the first discharge branch is in non-operation state, the voltage on the source line may be transmitted to the bit line via the turned on transistor such that the bit line and the source line have the same voltage.

In the operation process of the memory, it is generally impossible to apply a high voltage to the bit line directly but it is possible to apply a high voltage to the source line directly. In view of this, it is possible to apply a high voltage to the source line at first and then synchronize the high voltage to the bit line so that the bit line has the high voltage. Both the bit line and the source line have high voltages such that it is possible to erase the memory string from the bit line end and the source line end at the same time. That is, double-end erasing is implemented, and the erasing efficiency is improved.

Figure 20:
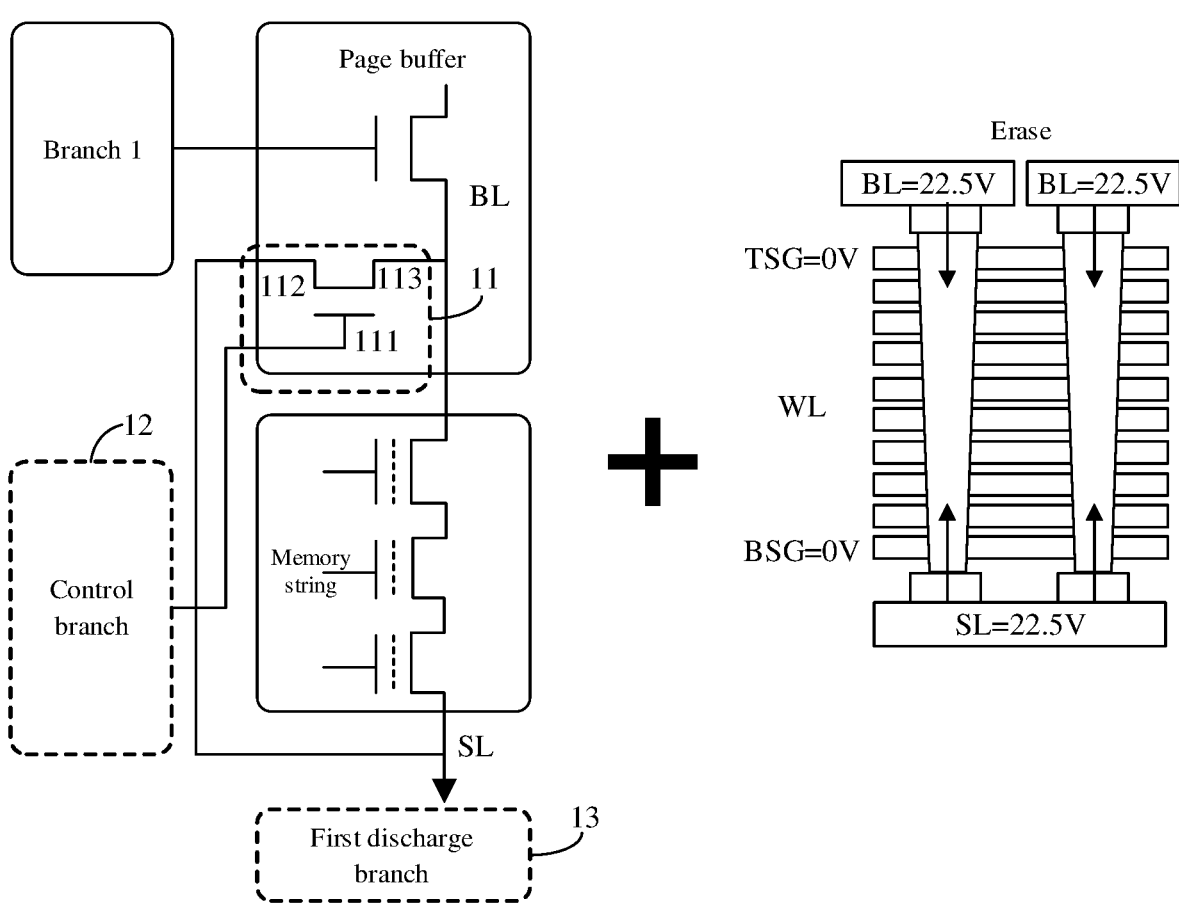
FIG. 20 is a diagram of a double-end erasing provided in an implementation of the present disclosure.

Illustratively, FIG. 20 shows a diagram of double-end erasing. In the memory structure shown in the left diagram of FIG. 20, one 113 of the source and drain of the transistor 11 is directly connected with the bit line (BL), one 112 of the source and drain of the transistor 11 is directly connected with the source line (SL). In this structure, it is possible to apply a high voltage (e.g., 22.5V) to the source line and then transmit the high voltage to the bit line via a turned on transistor 11 such that the bit line also has a high voltage (e.g., 22.5V). After both the source line and the bit line have a high voltage (e.g., 22.5V), the double-end erasing as shown in the right diagram in FIG. 20 may be realized. In the process of double-end erasing, a 0V voltage is applied to both TSG and BSG and data stored in the memory string may be erased from both the source line end and the bit line end based on GIDL (Gate Induced Drain Leakage).

With the operation method of memory as provided in implementations of the present disclosure, it is possible to limit the discharge current with the first discharge branch so as to control the discharge speed of the bit line and avoid TSG being coupled to a negative voltage. Furthermore, the bit line and the source line may be connected such that the bit line can reach a higher voltage to allow double-end erasing to be realized.

With the operation method of memory as provided in implementations of the present disclosure, the bit line and the first discharge branch are located at two ends, i.e. source and drain of the transistor and thus can connect the bit line with the first discharge branch via the turned on transistor and in turn discharge the bit line at a set discharge speed with the first discharge branch. The discharge speed of the bit line is controllable and the stability of the bit line discharge is high, which facilitates improving the operating stability of the memory in the bit line discharge process.

Figure 21:
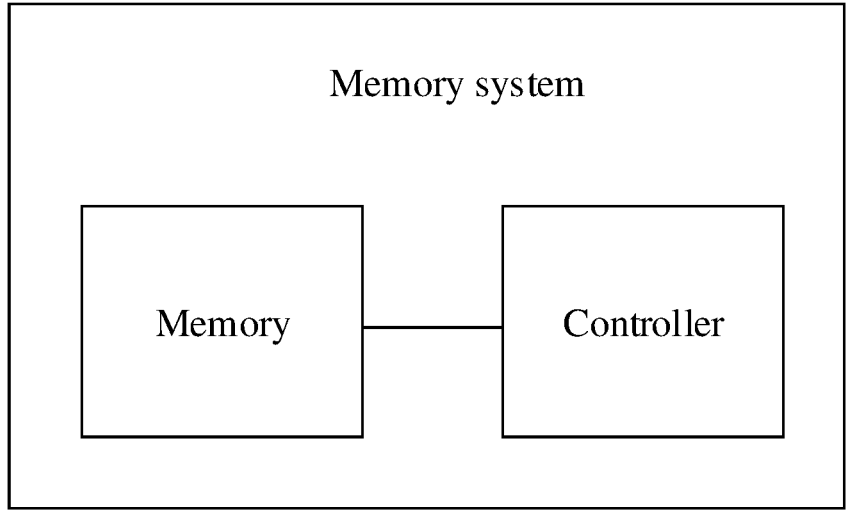
FIG. 21 is a structure diagram of a memory system provided in an implementation of the present disclosure.

An implementation of the present disclosure provides a memory system as shown in FIG. 21 including any of the above-described memories and a controller coupled with the memory, wherein the controller is configured to control the memory. Illustratively, the memory system may be the memory system 102 shown in FIG. 1.

It is to be understood that "plurality" mentioned in the description refers to two or more. "And/or" describes association relationship among associated objects and may denotes three relationships. For example, A and/or B may represent only A, both A and B and only B. Character "/" generically represents an "or" relationship between two successive associated objects.

What have been described above are only example implementations of the present disclosure and not intended to limit the present disclosure. Any modifications, equivalent substitutions and improvements made within the principle of the present disclosure should be covered by the scope of the present disclosure.

What is claimed is:

1. A memory, comprising:
   a bit line discharge circuit, comprising:
      a transistor;
      a control branch comprising a first sub-branch; and
      a first discharge branch comprising at least one transistor; and
   a bit line coupled to the bit line discharge circuit,
      wherein a gate of the transistor is connected with the control branch,
      wherein one of a source or a drain of the transistor is connected with the at least one transistor of the first discharge branch,
      wherein another of the source or the drain of the transistor is connected with the bit line,
      wherein the control branch is configured to turn on the transistor,
      wherein the at least one transistor of the first discharge branch is configured to discharge the bit line at a set discharge speed when the transistor is turned on, and
      wherein the first sub-branch is configured to apply a second voltage to the gate of the transistor when a voltage on the bit line is not smaller than a first voltage, the first voltage is greater than a target voltage associated with a discharging of the bit line, and the second voltage is greater than a threshold voltage of the transistor.

2. The memory of claim 1, further comprising:
   a source line,
      wherein the first sub-branch includes a voltage difference control module connected in series between the gate of the transistor and the source line,
      wherein the first sub-branch is configured to apply the second voltage output by the voltage difference control module to the gate of the transistor in case the voltage on the bit line is not smaller than the first voltage,
      wherein a voltage difference between the second voltage and the voltage on the source line is a reference voltage, and wherein the source line and the bit line are coupled at two ends of a same memory string.

3. The memory of claim 1, wherein:

the first sub-branch comprises a first power supply connected with the gate of the transistor, and the first sub-branch is configured to apply the second voltage provided by the first power supply to the gate of the transistor when the voltage on the bit line is not smaller than the first voltage.

4. The memory of claim 1, wherein:

the control branch further includes a second sub-branch for applying a third voltage to the gate of the transistor when the voltage on the bit line is smaller than the first voltage, the third voltage is smaller than the threshold voltage of the transistor, the bit line discharge circuit further includes a second discharge branch connected with the bit line for discharging the voltage on the bit line to the target voltage when the third voltage is applied to the gate of the transistor, and when the voltage on the bit line is smaller than the first voltage, a discharge speed at which the second discharge branch discharges the bit line is greater than a discharge speed at which the first discharge branch discharges the bit line.

5. The memory of claim 4, wherein:

the second sub-branch includes a second power supply connected with the gate of the transistor, and the second sub-branch is configured to apply the third voltage provided by the second power supply to the gate of the transistor when the voltage on the bit line is smaller than the first voltage.

6. The memory of claim 1, further comprising:

a source line, wherein one of a source and a drain of the transistor is connected with the first discharge branch via the source line, and wherein the source line and the bit line are coupled at two ends of a same memory string.

7. The memory of claim 1, wherein one of a source and a drain of the transistor is connected with the first discharge branch directly.

8. A method of operating a memory, comprising:

turning on a transistor of a bit line discharge circuit, one of a source or a drain of the transistor being connected with at least one transistor of a first discharge branch of the bit line discharge circuit, and another of the source or the drain of the transistor being connected with a bit line; and discharging the bit line at a set discharge speed via the transistor with the at least one transistor of the first discharge branch, wherein the turning on the transistor of the bit line discharge circuit comprises applying a second voltage to a gate of the transistor when a voltage on the bit line is not smaller than a first voltage, wherein the first voltage is greater than a target voltage associated with a discharging of the bit line, and wherein the second voltage being greater than a threshold voltage of the transistor.

9. The method of claim 8, wherein the applying the second voltage to the gate of the transistor when the voltage on the bit line is not smaller than the first voltage comprises:

applying the second voltage output by a voltage difference control module to the gate of the transistor when the voltage on the bit line is not smaller than the first voltage, a voltage difference between the second voltage and a voltage on a source line being a reference voltage, and the source line and the bit line being coupled at two ends of a same memory string.

10. The method of claim 8, wherein the applying the second voltage to the gate of the transistor when the voltage on the bit line is not smaller than the first voltage comprises:

applying the second voltage provided by a first power supply of the bit line discharge circuit to the gate of the transistor when the voltage on the bit line is not smaller than the first voltage.

11. The method of claim 8, further comprising:

applying a third voltage to the gate of the transistor when the voltage on the bit line is smaller than the first voltage, the third voltage being smaller than the threshold voltage of the transistor; and discharging the voltage on the bit line to the target voltage with a second discharge branch of the bit line discharge circuit connected with the bit line, wherein, when the voltage on the bit line is smaller than the first voltage, a discharge speed at which the second discharge branch discharges the bit line is greater than a discharge speed at which the first discharge branch discharges the bit line.

12. The method of claim 11, wherein the applying the third voltage to the gate of the transistor when the voltage on the bit line is smaller than the first voltage comprises:

applying the third voltage provided by a second power supply to the gate of the transistor when the voltage on the bit line is smaller than the first voltage.

13. The method of claim 8, wherein the discharging the bit line at the set discharge speed via the transistor with the first discharge branch comprises:

discharging a source line at the set discharge speed with the first discharge branch such that the bit line is discharged via the transistor at a same discharge speed as the source line, wherein one of the source or the drain of the transistor is connected with the first discharge branch via the source line, and wherein the source line and the bit line are coupled at two ends of a same memory string.

14. The method of claim 8, wherein the discharging the bit line at the set discharge speed via on transistor with the first discharge branch comprises:

discharging the bit line at the set discharge speed directly via the transistor with the first discharge branch, wherein one of a source or a drain of the transistor is directly connected with the first discharge branch.

15. The method of claim 9, further comprising:

detecting a voltage on the source line after discharging if the source line has been discharged; and disconnecting the voltage difference control module and the source line before a sum of the voltage on the source line after the discharging and the reference voltage is smaller than the threshold voltage of the transistor to guarantee that a voltage applied on the gate of the transistor is greater than the threshold voltage of the transistor.

16. The method of claim 8, further comprising:

controlling the first discharge branch to be in a non-operating state and transmitting a voltage on a source line to the bit line via the transistor so that the bit line has a voltage same as the source line, wherein the source line and the bit line are coupled at two ends of a same memory string, and wherein one of a source and a drain of the transistor is connected with the first discharge branch via the source line, or the one of the source or the drain of the transistor is directly connected with the first discharge branch and directly connected with the source line.

17. A memory system, comprising:

a memory, comprising:

a bit line discharge circuit, comprising:

a transistor;

a control branch; and a first discharge branch comprising at least one transistor;

a bit line coupled to the bit line discharge circuit; and a source line, wherein a gate of the transistor is connected with the control branch, wherein one of a source or a drain of the transistor is connected with the at least one transistor of the first discharge branch, wherein another of the source or the drain of the transistor is connected with the bit line, wherein the control branch is configured to turn on the transistor, wherein the at least one transistor of the first discharge branch is configured to discharge the bit line at a set discharge speed when the transistor is turned on, wherein one of a source and a drain of the transistor is connected with the first discharge branch via the source line, and wherein the source line and the bit line are coupled at two ends of a same memory string; and a controller coupled with the memory and configured to control the memory.

18. The memory system of claim 17, wherein:

the control branch comprises a first sub-branch for applying a second voltage to the gate of the transistor when a voltage on the bit line is not smaller than a first voltage, the first voltage is greater than a target voltage associated with a discharging of the bit line, and the second voltage is greater than a threshold voltage of the transistor.

19. The memory system of claim 18, wherein:

the first sub-branch includes a voltage difference control module connected in series between the gate of the transistor and the source line, the first sub-branch is configured to apply the second voltage output by the voltage difference control module to the gate of the transistor in case the voltage on the bit line is not smaller than the first voltage, a voltage difference between the second voltage and the voltage on the source line is a reference voltage, and the source line and the bit line are coupled at two ends of a same memory string.

20. The memory system of claim 18, wherein:

the first sub-branch comprises a first power supply connected with the gate of the transistor, and the first sub-branch is configured to apply the second voltage provided by the first power supply to the gate of the transistor when the voltage on the bit line is not smaller than the first voltage.

* * * * *